(12) United States Patent
Shah et al.

(10) Patent No.: US 8,325,079 B2
(45) Date of Patent: Dec. 4, 2012

(54) CNT-BASED SIGNATURE CONTROL MATERIAL

(75) Inventors: Tushar K. Shah, Columbia, MD (US); Harry C. Malecki, Abingdon, MD (US)

(73) Assignee: Applied NanoStructured Solutions, LLC, Baltimore, MD (US)

( * ) Notice: Subject to any disclaimer, the term of this patent is extended or adjusted under 35 U.S.C. 154(b) by 371 days.

(21) Appl. No.: 12/766,817

(22) Filed: Apr. 23, 2010

(65) Prior Publication Data

US 2010/0271253 A1    Oct. 28, 2010

Related U.S. Application Data

(60) Provisional application No. 61/173,435, filed on Apr. 28, 2009, provisional application No. 61/172,503, filed on Apr. 24, 2009.

(51) Int. Cl.
*H01Q 17/00* (2006.01)

(52) U.S. Cl. ................................. 342/4; 342/1

(58) Field of Classification Search ............ 342/1–4
See application file for complete search history.

(56) References Cited

U.S. PATENT DOCUMENTS

| | | | |
|---|---|---|---|
| 4,104,083 A | 8/1978 | Hirano | |
| 4,313,084 A | 1/1982 | Hosokawa et al. | |
| 4,488,203 A | 12/1984 | Muranaka et al. | |
| 4,515,107 A | 5/1985 | Fournier et al. | |
| 4,530,750 A | 7/1985 | Alsenberg et al. | |
| 4,707,349 A | 11/1987 | Hjersted | |
| 4,920,917 A | 5/1990 | Nakatani et al. | |
| 5,093,155 A | 3/1992 | Miyazaki et al. | |
| 5,130,194 A | 7/1992 | Baker et al. | |
| 5,156,225 A | 10/1992 | Murrin | |
| 5,173,367 A | 12/1992 | Liimatta et al. | |
| 5,221,605 A | 6/1993 | Bard et al. | |
| 5,238,808 A | 8/1993 | Bard et al. | |
| 5,246,794 A | 9/1993 | Blomgren et al. | |

(Continued)

FOREIGN PATENT DOCUMENTS

CN          101698975          4/2010

(Continued)

OTHER PUBLICATIONS

Ago, et al., "Colloidal Solution of Metal Nanoparticles as a Catalyst for Carbon Nanotube Growth", Proceedings Materials Research Society, Fall 2000, pp. A13.18.1-A13.18.5, vol. 633, Materials Research Society.

(Continued)

*Primary Examiner* — Timothy A Brainard
(74) *Attorney, Agent, or Firm* — McDermott Will & Emery LLP

(57) ABSTRACT

A radar absorbing composite includes a (CNT)-infused fiber material disposed in at least a portion of a matrix material. The composite absorbs radar in a frequency range from about 0.10 Megahertz to about 60 Gigahertz. The CNT-infused fiber material forms a first layer that reduces radar reflectance and a second layer that dissipates the energy of the radar. A method of manufacturing this composite includes disposing a CNT-infused fiber material in a portion of a matrix material with a controlled orientation of the CNT-infused fiber material within the matrix material, and curing the matrix material. The composite can be formed into a panel which is adaptable as a structural component of a transport vessel or missile for use in stealth applications.

17 Claims, 14 Drawing Sheets

U.S. PATENT DOCUMENTS

| | | | |
|---|---|---|---|
| 5,310,687 A | 5/1994 | Bard et al. |
| 5,449,574 A | 9/1995 | Higley |
| 5,470,408 A | 11/1995 | Nielson et al. |
| 5,514,217 A | 5/1996 | Niino et al. |
| 5,547,525 A | 8/1996 | Bennett et al. |
| 5,571,749 A | 11/1996 | Matsuda et al. |
| 5,583,318 A * | 12/1996 | Powell ..................... 174/390 |
| 5,639,984 A | 6/1997 | Nielson |
| 5,707,758 A | 1/1998 | Iwatsu et al. |
| 5,714,089 A | 2/1998 | Bard et al. |
| 5,731,147 A | 3/1998 | Bard et al. |
| 5,908,585 A | 6/1999 | Shibuta |
| 5,968,274 A | 10/1999 | Fujioka et al. |
| 5,997,832 A | 12/1999 | Lieber et al. |
| 6,140,138 A | 10/2000 | Bard et al. |
| 6,146,783 A | 11/2000 | Brohm et al. |
| 6,180,281 B1 | 1/2001 | Schneider et al. |
| 6,184,280 B1 | 2/2001 | Shibuta |
| 6,194,685 B1 | 2/2001 | Rutherford |
| 6,221,154 B1 | 4/2001 | Lee et al. |
| 6,232,706 B1 | 5/2001 | Dai et al. |
| 6,233,135 B1 | 5/2001 | Farahmandi et al. |
| 6,251,520 B1 | 6/2001 | Blizzard et al. |
| 6,265,466 B1 | 7/2001 | Glatkowski et al. |
| 6,331,209 B1 | 12/2001 | Jang et al. |
| 6,333,016 B1 | 12/2001 | Resasco et al. |
| 6,361,861 B2 | 3/2002 | Gao |
| 6,413,487 B1 | 7/2002 | Resasco et al. |
| 6,420,293 B1 | 7/2002 | Chang et al. |
| 6,430,031 B1 | 8/2002 | Dispennette et al. |
| 6,454,816 B1 | 9/2002 | Lee et al. |
| 6,455,021 B1 | 9/2002 | Saito |
| 6,465,057 B1 | 10/2002 | Nakahigashi et al. |
| 6,479,028 B1 | 11/2002 | Kaner et al. |
| 6,479,030 B1 | 11/2002 | Firsich |
| 6,491,789 B2 | 12/2002 | Niu |
| 6,495,258 B1 | 12/2002 | Chen et al. |
| 6,528,572 B1 | 3/2003 | Patel et al. |
| 6,564,744 B2 | 5/2003 | Nakahigashi et al. |
| 6,585,152 B2 | 7/2003 | Farahmandi et al. |
| 6,639,786 B2 | 10/2003 | Noguchi et al. |
| 6,653,619 B2 | 11/2003 | Chin et al. |
| 6,673,392 B2 | 1/2004 | Lee et al. |
| 6,692,717 B1 | 2/2004 | Smalley et al. |
| 6,765,949 B2 | 7/2004 | Chang |
| 6,773,466 B1 | 8/2004 | Hiratsuka et al. |
| 6,790,425 B1 | 9/2004 | Smalley et al. |
| 6,818,821 B2 | 11/2004 | Fujieda et al. |
| 6,831,826 B2 | 12/2004 | Iwaida et al. |
| 6,837,928 B1 | 1/2005 | Zhang et al. |
| 6,852,410 B2 | 2/2005 | Veedu et al. |
| 6,863,942 B2 | 3/2005 | Ren et al. |
| 6,887,451 B2 | 5/2005 | Dodelet et al. |
| 6,900,264 B2 | 5/2005 | Kumar et al. |
| 6,900,580 B2 | 5/2005 | Dai et al. |
| 6,908,572 B1 | 6/2005 | Derbyshire et al. |
| 6,913,075 B1 | 7/2005 | Knowles et al. |
| 6,934,600 B2 | 8/2005 | Jang et al. |
| 6,936,653 B2 | 8/2005 | McElrath et al. |
| 6,949,237 B2 | 9/2005 | Smalley et al. |
| 6,955,800 B2 | 10/2005 | Resasco et al. |
| 6,962,892 B2 | 11/2005 | Resasco et al. |
| 6,967,013 B2 | 11/2005 | Someya et al. |
| 6,979,709 B2 | 12/2005 | Smalley et al. |
| 6,986,853 B2 | 1/2006 | Glatkowski et al. |
| 6,986,877 B2 | 1/2006 | Takikawa et al. |
| 6,994,907 B2 | 2/2006 | Resasco et al. |
| 7,011,760 B2 | 3/2006 | Wang et al. |
| 7,018,600 B2 | 3/2006 | Yanagisawa et al. |
| 7,022,776 B2 | 4/2006 | Bastiaens et al. |
| 7,045,108 B2 | 5/2006 | Jiang et al. |
| 7,056,452 B2 | 6/2006 | Niu et al. |
| 7,060,326 B2 | 6/2006 | Hiel et al. |
| 7,061,749 B2 | 6/2006 | Liu et al. |
| 7,074,294 B2 | 7/2006 | Dubrow |
| 7,085,125 B2 | 8/2006 | Sung |
| 7,094,386 B2 | 8/2006 | Resasco et al. |
| 7,105,596 B2 | 9/2006 | Smalley et al. |
| 7,108,841 B2 | 9/2006 | Smalley et al. |
| 7,118,693 B2 | 10/2006 | Glatkowski et al. |
| 7,125,502 B2 | 10/2006 | Smalley et al. |
| 7,125,534 B1 | 10/2006 | Smalley et al. |
| 7,132,621 B2 | 11/2006 | Kumar et al. |
| 7,144,563 B2 | 12/2006 | Rao et al. |
| 7,148,619 B2 | 12/2006 | Den et al. |
| 7,151,129 B2 | 12/2006 | Ishikawa et al. |
| 7,153,452 B2 | 12/2006 | Ogale et al. |
| 7,157,068 B2 | 1/2007 | Li et al. |
| 7,160,532 B2 | 1/2007 | Liu et al. |
| 7,211,320 B1 | 5/2007 | Cooper et al. |
| 7,226,643 B2 | 6/2007 | Juang et al. |
| 7,235,159 B2 | 6/2007 | Gu et al. |
| 7,253,442 B2 | 8/2007 | Huang et al. |
| 7,261,779 B2 | 8/2007 | Gardner |
| 7,265,174 B2 | 9/2007 | Carroll et al. |
| 7,265,175 B2 | 9/2007 | Winey et al. |
| 7,278,324 B2 | 10/2007 | Smits et al. |
| 7,289,312 B2 | 10/2007 | Duff, Jr. |
| 7,294,302 B2 | 11/2007 | Kolde et al. |
| 7,329,698 B2 | 2/2008 | Noguchi et al. |
| 7,338,684 B1 | 3/2008 | Curliss et al. |
| 7,352,559 B2 | 4/2008 | Sung |
| 7,354,877 B2 | 4/2008 | Rosenberger et al. |
| 7,354,988 B2 | 4/2008 | Charati et al. |
| 7,372,880 B2 | 5/2008 | Jablonski et al. |
| 7,384,663 B2 | 6/2008 | Olry et al. |
| 7,399,794 B2 | 7/2008 | Harmon et al. |
| 7,407,640 B2 | 8/2008 | Barrera et al. |
| 7,407,901 B2 | 8/2008 | Bystricky et al. |
| 7,410,628 B2 | 8/2008 | Bening et al. |
| 7,419,601 B2 | 9/2008 | Cooper et al. |
| 7,431,965 B2 | 10/2008 | Grigorian et al. |
| 7,435,476 B2 | 10/2008 | Viswanathan et al. |
| 7,442,284 B2 | 10/2008 | Ren et al. |
| 7,445,817 B2 | 11/2008 | Kumar et al. |
| 7,448,441 B2 | 11/2008 | Hendricks et al. |
| 7,448,931 B2 | 11/2008 | Liu et al. |
| 7,459,627 B2 | 12/2008 | Lee et al. |
| 7,465,605 B2 | 12/2008 | Raravikar et al. |
| 7,466,539 B2 | 12/2008 | Dementiev et al. |
| 7,473,466 B1 | 1/2009 | Muradov |
| 7,479,052 B2 | 1/2009 | Kim et al. |
| 7,488,455 B2 | 2/2009 | Dai et al. |
| 7,504,078 B1 | 3/2009 | Jacques et al. |
| 7,510,695 B2 | 3/2009 | Smalley et al. |
| 7,531,267 B2 | 5/2009 | Kim |
| 7,532,454 B2 | 5/2009 | Plee et al. |
| 7,534,486 B2 | 5/2009 | Boerstoel et al. |
| 7,553,341 B2 | 6/2009 | Pan et al. |
| 7,563,411 B2 | 7/2009 | Jiang et al. |
| 7,563,428 B2 | 7/2009 | Resasco et al. |
| 7,569,425 B2 | 8/2009 | Huang et al. |
| 7,579,112 B2 | 8/2009 | Chiang et al. |
| 7,588,700 B2 | 9/2009 | Kwon et al. |
| 7,592,248 B2 | 9/2009 | Ventzek et al. |
| 7,597,869 B2 | 10/2009 | Hsiao |
| 7,608,798 B2 | 10/2009 | Kumar et al. |
| 7,611,579 B2 | 11/2009 | Lashmore et al. |
| 7,612,985 B2 | 11/2009 | Dementiev et al. |
| 7,615,204 B2 | 11/2009 | Ajayan et al. |
| 7,615,205 B2 | 11/2009 | Jiang et al. |
| 7,632,550 B2 | 12/2009 | Mizuno et al. |
| 7,632,569 B2 | 12/2009 | Smalley et al. |
| 7,700,943 B2 | 4/2010 | Raravikar et al. |
| 7,709,087 B2 | 5/2010 | Majidi et al. |
| 7,718,220 B2 | 5/2010 | D'Silva et al. |
| 7,771,798 B1 | 8/2010 | Grosse et al. |
| 7,776,777 B2 | 8/2010 | Kim et al. |
| 7,811,632 B2 | 10/2010 | Eres |
| 7,815,820 B2 | 10/2010 | Tan et al. |
| 7,816,709 B2 | 10/2010 | Balzano et al. |
| 7,862,795 B2 | 1/2011 | Zhang et al. |
| 7,871,591 B2 | 1/2011 | Harutyunyan et al. |
| 7,880,376 B2 | 2/2011 | Takai et al. |
| 7,927,701 B2 | 4/2011 | Curliss et al. |
| 2002/0035170 A1 | 3/2002 | Glatkowski et al. |
| 2002/0048143 A1 | 4/2002 | Lee et al. |

| | | | | | | |
|---|---|---|---|---|---|---|
| 2002/0085968 A1 | 7/2002 | Smalley et al. | | 2008/0182108 A1 | 7/2008 | Curliss et al. |
| 2002/0098135 A1 | 7/2002 | Smalley et al. | | 2008/0187482 A1 | 8/2008 | Chen et al. |
| 2002/0136683 A1* | 9/2002 | Smalley et al. ............... 423/461 | | 2008/0187648 A1 | 8/2008 | Hart et al. |
| 2003/0042147 A1 | 3/2003 | Talin et al. | | 2008/0195187 A1 | 8/2008 | Li et al. |
| 2003/0044678 A1 | 3/2003 | ESq. | | 2008/0212261 A1 | 9/2008 | Ajayan et al. |
| 2003/0102585 A1 | 6/2003 | Poulin et al. | | 2008/0247938 A1 | 10/2008 | Tsai et al. |
| 2003/0111333 A1 | 6/2003 | Montgomery et al. | | 2008/0248362 A1 | 10/2008 | Sayre et al. |
| 2003/0143453 A1 | 7/2003 | Ren et al. | | 2008/0251971 A1 | 10/2008 | Kim et al. |
| 2004/0007955 A1 | 1/2004 | Yaniv et al. | | 2008/0273290 A1 | 11/2008 | Dementiev et al. |
| 2004/0018375 A1 | 1/2004 | Banno et al. | | 2008/0279753 A1 | 11/2008 | Harutyunyan |
| 2004/0026234 A1 | 2/2004 | Vanden Brande et al. | | 2008/0286564 A1 | 11/2008 | Tsotsis |
| 2004/0071870 A1 | 4/2004 | Knowles et al. | | 2008/0297980 A1 | 12/2008 | Bourcier et al. |
| 2004/0082247 A1 | 4/2004 | Desai et al. | | 2009/0017301 A1 | 1/2009 | Moireau |
| 2004/0096389 A1 | 5/2004 | Lobovsky et al. | | 2009/0020734 A1 | 1/2009 | Jang et al. |
| 2004/0105807 A1 | 6/2004 | Fan et al. | | 2009/0029127 A1 | 1/2009 | Watanabe et al. |
| 2004/0111141 A1 | 6/2004 | Brabec et al. | | 2009/0047453 A1 | 2/2009 | Folaron et al. |
| 2004/0184981 A1 | 9/2004 | Liu et al. | | 2009/0047502 A1 | 2/2009 | Folaron et al. |
| 2004/0197546 A1 | 10/2004 | Rinzler et al. | | 2009/0053512 A1 | 2/2009 | Pyun et al. |
| 2004/0210289 A1 | 10/2004 | Wang et al. | | 2009/0059474 A1 | 3/2009 | Zhamu et al. |
| 2004/0241532 A1 | 12/2004 | Kim | | 2009/0068387 A1 | 3/2009 | Panzer et al. |
| 2004/0245088 A1 | 12/2004 | Gardner | | 2009/0068461 A1 | 3/2009 | Reneker et al. |
| 2004/0253167 A1 | 12/2004 | Silva et al. | | 2009/0072222 A1 | 3/2009 | Radisic et al. |
| 2005/0090176 A1 | 4/2005 | Dean et al. | | 2009/0081383 A1 | 3/2009 | Alberding et al. |
| 2005/0100501 A1 | 5/2005 | Veedu et al. | | 2009/0081441 A1 | 3/2009 | Shah et al. |
| 2005/0112052 A1 | 5/2005 | Gu et al. | | 2009/0087743 A1 | 4/2009 | Kim et al. |
| 2005/0113876 A1 | 5/2005 | Weiner et al. | | 2009/0092832 A1 | 4/2009 | Moireau |
| 2005/0119371 A1 | 6/2005 | Drzal et al. | | 2009/0098453 A1 | 4/2009 | Liu et al. |
| 2005/0170177 A1 | 8/2005 | Crawford et al. | | 2009/0099016 A1 | 4/2009 | Carruthers et al. |
| 2005/0172370 A1 | 8/2005 | Haq et al. | | 2009/0121219 A1 | 5/2009 | Song et al. |
| 2005/0176329 A1 | 8/2005 | Olry et al. | | 2009/0126783 A1 | 5/2009 | Lin et al. |
| 2005/0188727 A1 | 9/2005 | Greywall | | 2009/0136707 A1 | 5/2009 | Ueno |
| 2005/0214648 A1 | 9/2005 | Boulton et al. | | 2009/0140098 A1 | 6/2009 | Lengsfeld et al. |
| 2005/0231893 A1 | 10/2005 | Harvey | | 2009/0176100 A1 | 7/2009 | Higashi et al. |
| 2005/0238810 A1 | 10/2005 | Scaringe et al. | | 2009/0176112 A1 | 7/2009 | Kruckenberg et al. |
| 2005/0260412 A1 | 11/2005 | Gardner | | 2009/0181309 A1 | 7/2009 | Kwon et al. |
| 2005/0263456 A1 | 12/2005 | Cooper et al. | | 2009/0185327 A1 | 7/2009 | Seymour |
| 2005/0287064 A1 | 12/2005 | Mayne et al. | | 2009/0186214 A1 | 7/2009 | Lafdi et al. |
| 2006/0052509 A1 | 3/2006 | Saitoh | | 2009/0186276 A1 | 7/2009 | Zhamu et al. |
| 2006/0054866 A1 | 3/2006 | Ait-Haddou et al. | | 2009/0191352 A1 | 7/2009 | DuFaux et al. |
| 2006/0110599 A1 | 5/2006 | Honma et al. | | 2009/0192241 A1 | 7/2009 | Raravikar et al. |
| 2006/0121275 A1 | 6/2006 | Poulin et al. | | 2009/0208743 A1 | 8/2009 | Pettit |
| 2006/0126268 A1 | 6/2006 | Sung | | 2009/0212430 A1 | 8/2009 | Wyland |
| 2006/0159916 A1 | 7/2006 | Dubrow et al. | | 2009/0214800 A1 | 8/2009 | Saito |
| 2006/0177602 A1 | 8/2006 | Dijon et al. | | 2009/0220409 A1 | 9/2009 | Curliss et al. |
| 2006/0198956 A1 | 9/2006 | Eres | | 2009/0226673 A1* | 9/2009 | Friedersdorf et al. ........ 428/167 |
| 2006/0233692 A1 | 10/2006 | Scaringe et al. | | 2009/0244810 A1 | 10/2009 | Reynolds |
| 2006/0241236 A1* | 10/2006 | Kuznetsov et al. ............ 524/495 | | 2009/0258164 A1 | 10/2009 | Nakai et al. |
| 2006/0253942 A1 | 11/2006 | Barrera et al. | | 2009/0262484 A1 | 10/2009 | Miyagi |
| 2007/0020167 A1 | 1/2007 | Han et al. | | 2009/0272946 A1 | 11/2009 | Lu |
| 2007/0036709 A1* | 2/2007 | Lashmore et al. ......... 423/447.1 | | 2009/0282671 A1 | 11/2009 | Tao et al. |
| 2007/0048521 A1 | 3/2007 | Istvan | | 2009/0286079 A1 | 11/2009 | Barker et al. |
| 2007/0054105 A1 | 3/2007 | Hsiao | | 2009/0294753 A1 | 12/2009 | Hauge et al. |
| 2007/0070579 A1 | 3/2007 | Sung | | 2009/0311166 A1 | 12/2009 | Hart et al. |
| 2007/0076349 A1 | 4/2007 | Dementiev et al. | | 2009/0314510 A1 | 12/2009 | Kukowski et al. |
| 2007/0092431 A1 | 4/2007 | Resasco et al. | | 2010/0000770 A1 | 1/2010 | Gupta et al. |
| 2007/0110977 A1 | 5/2007 | Al-Haik et al. | | 2010/0035124 A1 | 2/2010 | Thompson et al. |
| 2007/0128960 A1 | 6/2007 | Ghasemi Nejhad et al. | | 2010/0059243 A1 | 3/2010 | Chang |
| 2007/0134555 A1 | 6/2007 | Ren et al. | | 2010/0074834 A1 | 3/2010 | Kim |
| 2007/0135588 A1 | 6/2007 | Diakoumakos et al. | | 2010/0087042 A1 | 4/2010 | Kim et al. |
| 2007/0166603 A1 | 7/2007 | Nakanishi et al. | | 2010/0098931 A1 | 4/2010 | Daniel et al. |
| 2007/0189953 A1 | 8/2007 | Bai et al. | | 2010/0099319 A1 | 4/2010 | Lashmore et al. |
| 2007/0237990 A1 | 10/2007 | Kim | | 2010/0159240 A1 | 6/2010 | Shah et al. |
| 2007/0241962 A1* | 10/2007 | Shinoda et al. ............... 342/361 | | 2010/0173228 A1 | 7/2010 | Wallace et al. |
| 2007/0259128 A1 | 11/2007 | Parsapour | | 2010/0178825 A1 | 7/2010 | Shah et al. |
| 2008/0010796 A1 | 1/2008 | Pan et al. | | 2010/0188833 A1 | 7/2010 | Liang et al. |
| 2008/0014431 A1 | 1/2008 | Lashmore et al. | | 2010/0192851 A1 | 8/2010 | Shah et al. |
| 2008/0020193 A1 | 1/2008 | Jang et al. | | 2010/0196697 A1 | 8/2010 | D'Silva et al. |
| 2008/0048364 A1 | 2/2008 | Armenlades et al. | | 2010/0197848 A1 | 8/2010 | Verghese et al. |
| 2008/0049380 A1 | 2/2008 | Miyahara et al. | | 2010/0203362 A1 | 8/2010 | Lam et al. |
| 2008/0053922 A1 | 3/2008 | Honsinger, Jr. et al. | | 2010/0206504 A1 | 8/2010 | Akiyama et al. |
| 2008/0057265 A1 | 3/2008 | Liang et al. | | 2010/0210159 A1 | 8/2010 | Zhu |
| 2008/0075954 A1 | 3/2008 | Wardle et al. | | 2010/0221424 A1 | 9/2010 | Malecki et al. |
| 2008/0102371 A1 | 5/2008 | Mitchell et al. | | 2010/0224129 A1 | 9/2010 | Malecki et al. |
| 2008/0117562 A1 | 5/2008 | Maruyama et al. | | 2010/0227134 A1 | 9/2010 | Shah et al. |
| 2008/0118753 A1 | 5/2008 | Poulin et al. | | 2010/0227155 A1 | 9/2010 | Bao et al. |
| 2008/0137890 A1 | 6/2008 | Petersen et al. | | 2010/0254885 A1 | 10/2010 | Menchhofer et al. |
| 2008/0160286 A1 | 7/2008 | Asrar et al. | | 2010/0258111 A1 | 10/2010 | Shah et al. |
| 2008/0170982 A1 | 7/2008 | Zhang et al. | | 2010/0270069 A1 | 10/2010 | Shar et al. |
| 2008/0173111 A1 | 7/2008 | Thostenson et al. | | 2010/0272891 A1 | 10/2010 | Malecki et al. |

| | | | |
|---|---|---|---|
| 2010/0276072 | A1 | 11/2010 | Shah et al. |
| 2010/0279569 | A1 | 11/2010 | Shah et al. |
| 2010/0311866 | A1 | 12/2010 | Huang et al. |
| 2011/0024409 | A1 | 2/2011 | Shah et al. |
| 2011/0024694 | A1 | 2/2011 | Shah et al. |
| 2011/0036829 | A1* | 2/2011 | Fugetsu et al. ............... 219/541 |
| 2011/0089958 | A1 | 4/2011 | Malecki et al. |
| 2011/0123735 | A1 | 5/2011 | Shah et al. |
| 2011/0124253 | A1 | 5/2011 | Shah et al. |
| 2011/0124483 | A1 | 5/2011 | Shah et al. |
| 2011/0143087 | A1 | 6/2011 | Alberding et al. |
| 2011/0163274 | A1 | 7/2011 | Plee et al. |
| 2011/0171469 | A1 | 7/2011 | Shah et al. |
| 2011/0174519 | A1 | 7/2011 | Shah et al. |
| 2011/0186775 | A1 | 8/2011 | Shah et al. |
| 2011/0216476 | A1 | 9/2011 | Fleischer et al. |
| 2011/0242731 | A1 | 10/2011 | Fleischer et al. |
| 2011/0297892 | A1 | 12/2011 | Shah et al. |
| 2011/0304964 | A1 | 12/2011 | Fleischer et al. |
| 2012/0000691 | A1 | 1/2012 | Shah et al. |
| 2012/0052363 | A1 | 3/2012 | Fleischer |

FOREIGN PATENT DOCUMENTS

| | | |
|---|---|---|
| IN | 01900DE2008 A | 3/2010 |
| JP | 2004/247064 A | 9/2004 |
| KR | 100829001 | 5/2008 |
| TW | 200833861 | 8/2008 |
| WO | WO 03082733 | 10/2003 |
| WO | WO/2006/048531 A1 | 5/2006 |
| WO | WO/2006/115486 A1 | 11/2006 |
| WO | WO 2007/015710 | 2/2007 |
| WO | WO/2007/061854 A2 | 5/2007 |
| WO | WO/2007/089118 A1 | 8/2007 |
| WO | WO/2007/149109 A2 | 12/2007 |
| WO | WO 2008/012196 | 1/2008 |
| WO | WO/2008/041183 A2 | 4/2008 |
| WO | WO/2008/054541 A2 | 5/2008 |
| WO | WO/2008/085634 A1 | 7/2008 |
| WO | WO 2008/115168 | 9/2008 |
| WO | WO/2008/115640 A2 | 9/2008 |
| WO | WO 2008/145787 | 12/2008 |
| WO | WO 2009/004346 | 1/2009 |
| WO | WO 2009110885 | 9/2009 |

OTHER PUBLICATIONS

Bradford, et al., "Electrical Conductivity Study of Carbon nanotube Yarns, 3-D Hybrid Braids and their Composites", Jouranl of Composite Materials, pp. 1533-1545, vol. 42, No. 15, SAGE Productions, Los Angeles, London, New Delhi and Singapore.

Bubert, et al., "Basic analytical investigation of plasma-chemically modified carbon fibers", Spectrochimica Acta Part B., 2002, pp. 1601-1610, vol. 57, Elsevier Science B.V.

Chae, et al., "A comparison of reinforcement efficiency of various types of carbon nanotubes in polyacrylonitrile fiber", Polymer, Nov. 21, 2005, pp. 10925-10935, vol. 46, No. 24, Elsevier Ltd.

Che, et al., "Chemical Vapor Deposition Based Synthesis of Carbon Nanotubes and Nanofibers Using a Template Method", Chem. Mater., 1998, pp. 260-267, vol. 10, American Chemical Society.

Chen, et al., "Basalt fiber-epoxy laminates with functionalized multi-walled carbon nanotubes", Composites, Part A, 2009, pp. 1082-1089, vol. 40, Elsevier Ltd.

Chen, et al., "Pulsed electrodeposition of Pt nanoclusters on carbon nanotubes modified carbon materials using diffusion restricting viscous electroyles", Electrochemistry Communications, Jun. 2007, pp. 1348-1354, vol. 9, Elsevier B.V.

Ci, et al., "Direct Growth of Carbon Nanotubes on the Surface of Ceramic Fibers", Carbon, 2005, pp. 883-886, vol. 43, No. 4, Elsevier Ltd.

Franz, et al., "Carbon Single-Wall Nanotube Growth in a Volumetrically Confined Arc Discharge System", U.S. Departement of Energy Journal of Undergraduate Research, pp. 66-69, publication date unknown.

Garcia, et al., "Aligned Carbon Nanotube Reinforcement of Advanced Composite Ply Interfaces," 49th AIAA/ASCE/AHS/ASC Structures, Structural Dynamics, and Materials Conference, Apr. 7-10, 2008, Schaumburg, IL, MIT, American Institute of Aeronautics and Astronautics, Inc.

Hsu, et al., "Optical Absorption and Thermal Transport of Individual Suspended Carbon Nanotube Bundles", Nano Lett., 2009, pp. 590-594, vol. 9, No. 2, American Chemical Society, Publication Date (Web): Jan. 13, 2009.

Jiang, et al., "Carbon nanotube-coated solid-phase microextraction metal fiber based on sol-gel technique", Journal of Chromatography A., May 29, 2009, pp. 4641-4647, vol. 1216, Elsevier B.V.

Jiang, et al., "Plasma-Enhanced Deposition of Silver Nanoparticles onto Polymer and Metal Surfaces for the Generation of Antimicrobial Characteristics", Journal of Applied Polymer Science, 2004, pp. 1411-1422, vol. 93, Wiley Periodicals, Inc.

Jung, et al., "Fabrication of radar absorbing structure (RAS) using GFR-nano composite and spring-back compensation of hybrid composite RAS shells", Composite Structures, 2006, pp. 571-576, vol. 75, Elsevier Ltd.

Kim, et al., "Processing, characterization, and modeling of carbon nanotube-reinforced multiscale composites," Composites Science and Technology, 2009, pp. 335,342, vol. 69, Elsevier Ltd.

Kind, et al., "Patterned Films of Nanotubes Using Microcontact Printing of Catalysts", Adv. Mater., 1999, pp. 1285-1289, vol. 11, No. 15, Wiley-VCH Verlag GmbH, D-69469 Weinheim.

Laachachi, et al., "A chemical method to graft carbon nanotubes onto a carbon fiber", Materials Letters, 2008, pp. 394-397, vol. 62, Elsevier B.V.

Lee, "Syntheses and properties of fluorinated carbon materials", Journal of Fluorine Chemistry, 2007, pp. 392-403, vol. 128, Elsevier B.V.

Lee, et al., "Fabrication and design of multi-layered radar absorbing structures of MWNT-filled glass/epoxy plain-weave composites", Composite Structures, 2006, pp. 397-405, vol. 76, Elsevier Ltd.

Li, et al., "A Miniature glucose/$O_2$ biofuel cell with single-walled carbon nanotubes-modified carbon fiber microelectrodes as the substrate", Electrochemistry Communications, Jun. 2008, pp. 851-854, vol. 10, Elsevier B.V.

Li, et al., "Electromagnetic Interference (EMI) Shielding of Single-Walled Carbon Nanotube Epoxy Composites", Nano Lett., 2006, pp. 1141-1145, vol. 6, No. 6, American Chemical Society.

Makris, et al., "Carbon Nanotubes Growth and Anchorage to Carbon Fibres", Carbon Nanotubes, 2006, pp. 57-58, vol. 222, Springer, the Netherlands.

Meyyappan, et al., "Carbon nanotube growth by PECVD: a review", Plasma Sources Sci. Technol., 2003, pp. 205-216, vol. 12, IOP Publishing Ltd, UK.

Mylvaganam, "Fabrication and Application of Polymer Composites Comprising Carbon Nanotubes", Recent Pat Nanotechnol., 2007, pp. 59-65, vol. 1, Bentham Science Publishers, Ltd.

Panhuis, et al., "Carbon Nanotube Mediated Reduction in Optical Activity in Polyaniline Composite Materials", J. Phys. Chem. C, 2008, pp. 1441-1445, vol. 112, American Chemical Society.

Pisco, et al., "Hollow fibers integrated with single walled carbon nanotubes: Bandgap modification and chemical sensing capability", Sensors and Actuators B, 2008, pp. 163-170, vol. 129, Elsevier B.V.

Račkauskas "Carbon nanotube growth and use in energy sector", Energetika, 2006, pp. 43-46, vol. 2.

Satishkumar, et al., "Bundles of aligned carbon nanotubes obtained by the pyrolysis of ferrocene-hydrocarbon mixtures: role of the metal nanoparticles produced in situ", Chemical Physics Letters, 1999, pp. 158-162, vol. 307, Elsevier Science B.V.

Suh, et al., "Highly ordered two-dimensional carbon nanotube arrays", Applied Physics Letters, Oct. 4, 2002, pp. 2047-2049, vol. 75, No. 14, American Institute of Physics.

Thostenson, et al., "Carbon nanotube/carbon fiber hybrid multiscale composites", J. Appl. Phys., 2002, pp. 6034-6037, vol. 91, No. 9, American Institute of Physics.

Wang, et al., "Penetration depth of atmospheric pressure plasma surface modification into multiple layers of polyester fabrics", Surface and Coatings Technology, 2007, pp. 77-83, vol. 202, Elsevier B.V.

Wang, et al., "Processing and property investigation of single-walled carbon nanotube (SWNT) buckypaper/epoxy resin matrix nanocomposites", Composites, Part A, 2004, pp. 1225-1232, vol. 35, Elsevier Ltd.

Wichmann, et al., "Glass-fibre-reinforced composites with enhanced mechanical and electrical properties—Benefits and limitations of a nanoparticle modified matrix", Engineering Fracture Mechanics, 2006, pp. 2346-2359, vol. 73, Elisevier Ltd.

Xu, et al., "Bone-Shaped Nanomaterials for Nanocomposite Applications", Nano Lett., 2003, pp. 1135-1139, vol. 3, No. 8, American Chemical Society.

Yabe, et al., Synthesis of well-aligned carbon nanotubes by radio frequency plasma enhanced CVD method, Diamond and Related Materials, 2004, pp. 1292-1295, vol. 13, Elsevier B.V.

Yanagishita, et al., "Carbon Nanotubes with a Triangular Cross-section, Fabricated Using Anodic Porous Alumina as the Temple", Adv. Mater., 204, pp. 429-432, vol. 16, No. 5, Wiley-VCH Verlag GmbH & Co. KGaA, Weinheim.

Yang, et al., "Electrical Conductivity and Electromagnetic Interference Shielding of Multi-walled Carbon Nanotube Filled Polymer Composites" Mater. Res. Soc. Symp. Proc., 2005, pp. HH5.3.1-HH.5.3.5, vol. 858E, Materials Research Society.

Yeh, et al., "Mechanical properties of phenolic-based nanocomposites reinforced by multi-walled carbon nanotubes and carbon fibers", Composites: Part A, 2008, pp. 677-684, vol. 39, No. 4.

Zhang, et al., "In situ growth of carbon nanotubes on inorganic fibers with different surface properties," Materials Chemistry and Physics, 2008, pp. 317-321, vol. 107, Science Direct.

Zhao, et al., "Growth of carbon nanotubes on the surface of carbon fibers", Carbon, 2007, pp. 380-383, vol. 46, No. 2, Elsevier Ltd.

Zhao, et al., "The growth of multi-walled carbon nanotubes with different morphologies on carbon fibers", Carbon, 2005, pp. 651-673, vol. 43, Elsevier Ltd.

Zhu, et al., "Carbon nanotube growth on carbon fibers", Diamond and Related Materials, 2003, pp. 1825-1825, vol. 12, Elsevier B.V.

Zhu, et al., "Synthesis of single-walled carbon nanotubes by the vertical floating catalyst method," Chinese Science Bulletin, 2002, pp. 159-162, vol. 47, No. 2.

Andrews, et al., "Nanotube Composite Carbon Fibers," Applied Physics Letters, Aug. 1999, vol. 75, No. 9, pp. 1329-1331.

Arepalli, et al., "Carbon-Nanotube-Based Electrochemical Double-Layer Capacitor Technologies for Spaceflight Applications,"JOM, Dec. 2005, pp. 26-31.

U.S. Appl. No. 12/766,817, filed Apr. 23, 2010, Tushar K. Shah.
U.S. Appl. No. 61/295,621, filed Jan. 15, 2010, Harry C. Malecki.
U.S. Appl. No. 61/297,704, filed Jan. 22, 2010, Tushar K. Shah.

Cui, et al., "Carbon-Silicon Core-Shell Nanowires As High Capacity Electrode for Lithium Ion Batteries," American Chemical Society, vol. xx, No. x.

Fiedler et al, "Can Carbon Nanotubes Be Used to Sense Damage in Composites?", Annales de Chimie—Science des Materiaux, 2004, vol. 29, No. 6, pp. 81-94.

Hsieh, et al., "Synthesis of Carbon Nanotubes on Carbon Fabric for Use As electrochemical Capacitor," Microporous and Mesoporous Materials, (2009), pp. 155-159, vol. 122.

Jo, et al., "Field Emission of Carbon Nanotubes Grown on Carbon Cloth," Applied Physics Letters, Aug. 2, 2004, pp. 810-812, vol. 85, No. 5.

Kramer, et al., Constrained Iron Catalysts for Single-Walled Carbon Nanotube Growth?, Langmuir 2005, 21, 8466-8470 [http://pubs.acs.org/dol/abs/10.1021/la0506729].

Parrish, "Carbon Nanotubes and Carbon Layer Nanostructured Composites Grown in Improved Process," Capella University, Before It's News, Jul. 9, 2010.

Zhang et al., "Integration and characterization of aligned carbon nanotubes on metal/silicon substrates and effects of water", Applied Surface Science 255 (2009) 5003-5008, entire document.

Zhao et al., "The Use of Carbon Nanotubes to Sense Matrix Stresses Around a Single Glass Fiber," Composites Science and Technology, Nov. 2001, vol. 61, No. 14, pp. 2139-2143.

Zhao, et al., "Carbon Nanosheets As the Electrode Material in Supercapacitors," Journal of Power Sources 194 (2009 pp. 1208-1212.

* cited by examiner

CNT-BASED SIGNATURE CONTROL MATERIAL

STATEMENT OF RELATED APPLICATIONS

This application claims the benefit of U.S. Provisional Application No. 61/173,435, filed Apr. 28, 2009, and U.S. Provisional Application No. 61/172,503, filed Apr. 24, 2009, both of which are incorporated herein by reference in their entirety.

FIELD OF INVENTION

The present invention relates to generally to radar absorbing materials.

BACKGROUND

Low observable, or stealth, technology is utilized on aircrafts, ships, submarines, and missiles, for example, to make them less visible or observable to radar, infrared, sonar and other detection methods. Various radar absorbing materials (RAMs), which absorb electromagnetic frequencies, such as in the radar range, have been developed for such low observable applications. However, the RAMs presently employed have some drawbacks. For example, many RAMs are not an integral part of the surface of a low observable structure. Instead, the RAMs are applied as coatings or paints over the surface of the low observable structure making them heavier, and prone to wear, chipping, and failure. An example of such a RAM includes iron ball paint, which contains tiny spheres coated with carbonyl iron or ferrite. Moreover, these coatings require bonding to the surface of the structure because they are not an integrated part of the structure or surface.

Another example of a RAM is urethane foam impregnated with carbon. Such RAMs are used in very thick layers. Such RAMs are inherently non-structural in nature such that they add weight and volume to structures while providing no structural support. These types of foam RAMs are frequently cut into long pyramids. For low frequency damping, the distance from base to tip of the pyramid structure is often 24 inches, while high frequency panels can be as short as 3-4 inches.

Another RAM takes the form of doped polymer tiles bonded to the surface of the low observable structure. Such tiles which include neoprene doped with carbon black or iron particles, for example, are prone to separation, particularly in extreme operating environments such as extremely high or low temperatures, and/or high altitudes. Finally, numerous RAMs do not perform adequately in the long radar wavelength band, about 2 GHz.

It would be beneficial to develop alternative RAMs that address one or more of the aforementioned issues. The present invention satisfies this need and provides related advantages as well.

SUMMARY OF THE INVENTION

In some aspects, embodiments disclosed herein relate to a radar absorbing composite that includes a (CNT)-infused fiber material disposed in at least a portion of a matrix material. The composite is capable of absorbing radar in a frequency range from between about 0.10 Megahertz to about 60 Gigahertz. The CNT-infused fiber material forms a first layer that reduces radar reflectance and a second layer that dissipates the energy of the absorbed radar.

In some aspects, embodiments disclosed herein relate to a method of manufacturing a radar absorbing composite that includes a (CNT)-infused fiber material disposed in at least a portion of a matrix material. The composite is capable of absorbing radar in a frequency range from between about 0.10 Megahertz to about 60 Gigahertz. The CNT-infused fiber material forms a first layer that reduces radar reflectance and a second layer that dissipates the energy of the absorbed radar. The method includes disposing a CNT-infused fiber material in a portion of a matrix material with a controlled orientation of the CNT-infused fiber material within the matrix material, and curing the matrix material. The controlled orientation of the CNT-infused fiber material controls the relative orientation of CNTs infused thereon.

In some aspects, embodiments disclosed herein relate to a panel that includes a composite including a (CNT)-infused fiber material disposed in at least a portion of a matrix material. The composite is capable of absorbing radar in a frequency range from between about 0.10 Megahertz to about 60 Gigahertz. The CNT-infused fiber material forms a first layer that reduces radar reflectance and a second layer that dissipates the energy of the absorbed radar. The panel is adaptable to interface as a structural component of a transport vessel or missile for use in stealth applications.

In some aspects, embodiments disclosed herein relate to a transport vessel that includes the aforementioned composite in the form of a panel. The CNTs infused on the fiber material have a controlled orientation within the composite material.

In some aspects, embodiments disclosed herein relate to a projectile that includes the aforementioned composite in the form of a panel. The CNTs infused on the fiber material have a controlled orientation within the composite material.

DETAILED DESCRIPTION

Figure 1:
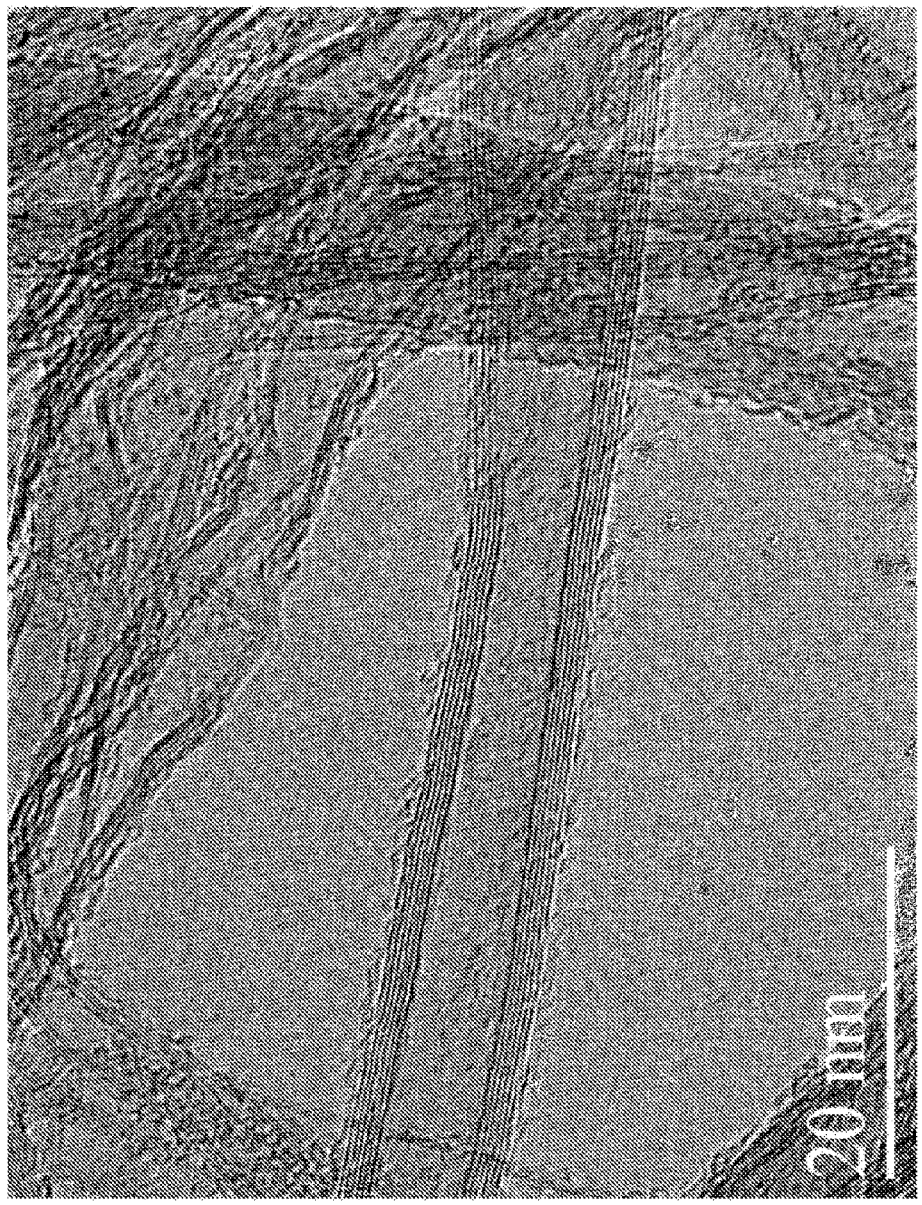
FIG. 1 shows a transmission electron microscope (TEM) image of a multi-walled CNT (MWNT) grown on AS4 carbon fiber via a continuous CVD process.

The present invention is directed, in part, to composite materials that are RAMs. The radar absorbing composite materials disclosed herein have CNT-infused fiber materials disposed in a portion of a matrix material. CNTs have desirable electromagnetic absorption properties due to their high aspect ratio, high conductivity, and when infused to a fiber material can be tailored for specific surface coverage densities. The CNTs in the overall composite are capable of absorbing radar and dissipating the absorbed energy as heat, for example.

The radar absorbing composite materials of the invention can improve the absorption characteristics of already low observable surfaces. In some embodiments, the CNT-infused fibers impart improved signature control of dielectric (insolative—transparent to radar) as well as conductive (significantly reflective to radar) composite materials, resulting in the ability to use low weight, high strength composites. Some such composites may have been previously limited in application due to their inherently poor signature control capabilities.

Radar absorbing composite materials of the invention can provide an absorbent surface that is nearly a black body across different sections of the electromagnetic spectrum including the visible region and various radar bands. CNTs infused on fibers allows for tailored arrangement of particular CNT densities in various layers to create a radar absorbing structure. That is, the radar absorbing capacity can be achieved by providing varying CNT density across the depth of the material. The fiber material is a scaffold that organizes the CNTs in an array that provides an overall composite with appropriate CNT density at different depths to provide internal reflection in some layers and effective percolation pathways for dissipation of the energy upon radar absorption in other layers. Still other layers can provide a combination of internal reflection and percolation pathways to dissipate the absorbed radar energy. The infused CNTs can be tailored to have a uniform length, density, and controlled orientation on the fiber material based on a continuous CNT infusion process. The CNT-infused fiber thus obtained is then disposed within a composite structure to maximize radar absorption.

In particular, near the surface of a composite, CNT densities can be relatively low creating a material that has a dielectric constant similar to air or a refractive index close to air creating a black body-like structure where radar reflectance is substantially minimized. That is, in order to suppress reflection, the refractive index of the object can be close to that of air. This solution to minimize reflectance is evident from Fresnel's law:

$$R=(n-n_0)^2/(n+n_0)^2$$

where R is reflectance, n is the refractive index of the object, and $n_0$ is the refractive index of air. The CNT density on the fiber material can be modulated in the continuous process described herein below such that the CNT-infused fiber material can be tuned to exhibit a CNT density such that the refractive index, n, in a layer of CNT-infused fiber within a composite structure approximates that of air, $n_0$.

By relying on CNTs for radar absorption, the composite materials can utilize either conducting or insulating fiber materials and/or matrices. Moreover, the radar absorbing composite materials can be integrated as part of the surface and/or the overall structure of the low observable. In some embodiments, the entire structure can function as a RAM, obviating the issues of wear, chipping and the like associated with coated RAM paints, for example. Significantly, unlike the urethane-type foams, the RAMS of the present invention are structural and thus, substantial weight reductions can be achieved relative to their foam counterpart. In some embodiments, CNT-infused fiber materials can be employed as a coating while avoiding the problems associated with chipping/wear, and the like due to the extended lengths of fiber material employed.

The manufacturing process to create CNT-infused fibers for the aforementioned radar absorbing materials is described herein further below. The process is amenable to large scale continuous processing. In the process, CNTs are grown directly on carbon, glass, ceramic, or similar fiber materials of spoolable dimensions, such as tows or rovings. The nature of the CNT growth is such that a dense forest is deposited at lengths that can be tuned between about 100 nanometers to about 500 microns long, the length being controlled by various factors as described below. This forest can be oriented such that the CNTs are perpendicular to the surface of each individual filament of a fiber material thus providing radial coverage. In some embodiments, the CNTs can be further processed to provide an orientation that is parallel to the axis of the fiber material. The resulting CNT-infused fiber materials can be wound as manufactured or can be woven into fabric goods for use in producing the radar absorbing composite materials used in low observable structures. Significantly, the continuous process can allow for the production of sections of CNT-infusion with varied CNT density. As explained further below, this readily allows for the manufacture of multi-layered structures which when assembled, contribute to the overall radar absorbing capability.

As used herein, the term "radar absorbing composite material" refers to any composite material that has at least a CNT-infused fiber material disposed in a matrix material. The radar absorbing composite materials of the invention have three components, CNTs, a fiber material, and a matrix material, that create an organized hierarchy wherein the CNTs are organized by the fiber material to which they are infused. The CNT-infused fiber material is, in turn, organized by the matrix material in which it is disposed. The CNTs, arranged in particular densities according to the depth of a given layer, can prevent radar reflectance and/or absorb electromagnetic (EM) radiation associated with a radar transmitting source or reflected EM from an object in detection applications. The absorbed radar can be converted to heat and/or an electrical signal.

As used herein, the term "radar" refers to any of the common bands of radar frequencies ranging from about 0.10 Megahertz to about 60 Gigahertz. Radar absorbing composite materials of the present invention are particularly effective, for example, in the L- through K-band as described herein further below.

As used herein, the term "radar absorption capacity" refers to the ability of the radar absorbing composite materials of the present invention to absorb electromagnetic radiation of any radar band.

As used herein, the term "fiber material" refers to any material which has fiber as its elementary structural component. The term encompasses fibers, filaments, yarns, tows, tows, tapes, woven and non-woven fabrics, plies, mats, 3D woven structures and the like.

As used herein, the term "spoolable dimensions" refers to fiber materials having at least one dimension that is not limited in length, allowing for the material to be stored on a spool or mandrel. Fiber materials of "spoolable dimensions" have at least one dimension that indicates the use of either batch or continuous processing for CNT infusion as described herein. Fiber materials of "spoolable dimensions" can be obtained commercially as glass, carbon, ceramic, and similar products. An exemplary carbon fiber material of spoolable dimensions that is commercially available is exemplified by AS4 12 k carbon fiber tow with a tex value of 800 (1 tex=1 g/1,000 m) or 620 yard/lb (Grafil, Inc., Sacramento, Calif.). Commercial carbon fiber tow, in particular, can be obtained in 5, 10, 20, 50, and 100 lb. (for spools having high weight, usually a 3 k/12K tow) spools, for example, although larger spools may require special order. Processes of the invention operate readily with 5 to 20 lb. spools, although larger spools are usable. Moreover, a pre-process operation can be incorporated that divides very large spoolable lengths, for example 100 lb. or more, into easy to handle dimensions, such as two 50 lb spools.

As used herein, the term "carbon nanotube" (CNT, plural CNTs) refers to any of a number of cylindrically-shaped allotropes of carbon of the fullerene family including single-walled carbon nanotubes (SWNTs), double-walled carbon nanotubes (DWNTs), and multi-walled carbon nanotubes (MWNTs). CNTs can be capped by a fullerene-like structure or open-ended. CNTs include those that encapsulate other materials.

As used herein "uniform in length" refers to the length of CNTs grown in a reactor. "Uniform length" means that the CNTs have lengths with tolerances of plus or minus about 20% of the total CNT length or less, for CNT lengths varying from between about 1 micron to about 500 microns. At very short lengths, such as 1-4 microns, this error may be in a range from between about plus or minus 20% of the total CNT length up to about plus or minus 1 micron, that is, somewhat more than about 20% of the total CNT length. In signature control (radar absorption) the lengths (as well as density of coverage) of the CNTs can be used to modulate radar absorption and can be optimized for absorption maxima in a targeted radar band.

As used herein "uniform in distribution" refers to the consistency of density of CNTs on a carbon fiber material. "Uniform distribution" means that the CNTs have a density on the carbon fiber material with tolerances of plus or minus about 10% coverage defined as the percentage of the surface area of the fiber covered by CNTs. This is equivalent to ±1500 CNTs$\mu m^2$ for an 8 nm diameter CNT with 5 walls. Such a figure assumes the space inside the CNTs as fillable.

As used herein, the term "infused" means bonded and "infusion" means the process of bonding. Such bonding can involve direct covalent bonding, ionic bonding, pi-pi, and/or van der Waals force-mediated physisorption. For example, in some embodiments, the CNTs can be directly bonded to the carbon fiber material. Bonding can be indirect, such as the CNT infusion to the carbon fiber material via a barrier coating and/or an intervening transition metal nanoparticle disposed between the CNTs and carbon fiber material. In the CNT-infused carbon fiber materials disclosed herein, the carbon nanotubes can be "infused" to the carbon fiber material directly or indirectly as described above. The particular manner in which a CNT is "infused" to a carbon fiber materials is referred to as a "bonding motif."

As used herein, the term "transition metal" refers to any element or alloy of elements in the d-block of the periodic table. The term "transition metal" also includes salt forms of the base transition metal element such as oxides, carbides, nitrides, and the like.

As used herein, the term "nanoparticle" or NP (plural NPs), or grammatical equivalents thereof refers to particles sized between about 0.1 to about 100 nanometers in equivalent spherical diameter, although the NPs need not be spherical in shape. Transition metal NPs, in particular, serve as catalysts for CNT growth on the carbon fiber materials.

As used herein, the term "sizing agent," "fiber sizing agent," or just "sizing," refers collectively to materials used in the manufacture of carbon fibers as a coating to protect the integrity of carbon fibers, provide enhanced interfacial interactions between a carbon fiber and a matrix material in a composite, and/or alter and/or enhance particular physical properties of a carbon fiber. In some embodiments, CNTs infused to carbon fiber materials behave as a sizing agent.

As used herein, the term "matrix material" refers to a bulk material than can serve to organize sized CNT-infused fiber materials in particular orientations, including random orientation. The matrix material can benefit from the presence of the CNT-infused fiber material by imparting some aspects of the physical and/or chemical properties of the CNT-infused fiber material to the matrix material. In radar absorption applications, the matrix material in conjunction fiber material, provide controlled CNT densities and controlled CNT orientation. Such control is far more difficult to achieve by simple mixing of loose CNTs with the matrix alone. The greater control of densities along the CNT-infused fiber material provides a means to form layers that prevent reflectance of radar and layer that provide percolation pathways to dissipate the absorbed radar energy. The RAMs of the present invention typically have higher density of CNTs in lower ply layers that at the surface.

As used herein, the term "material residence time" refers to the amount of time a discrete point along a fiber material of spoolable dimensions is exposed to CNT growth conditions during the CNT infusion processes described herein. This definition includes the residence time when employing multiple CNT growth chambers.

As used herein, the term "linespeed" refers to the speed at which a fiber material of spoolable dimensions can be fed through the CNT infusion processes described herein, where linespeed is a velocity determined by dividing CNT chamber(s) length by the material residence time.

In some embodiments, the present invention provides a radar absorbing composite material that includes a (CNT)-infused fiber material disposed in at least a portion of a matrix material. The composite material is capable of absorbing radar in a frequency range from between about 0.1 MHz to about 60 GHz. 1. The CNT-infused fiber material can lay up in the composite to form a first layer that reduces radar reflectance, that is, transmits incident radar, and a second layer that dissipates the energy of the absorbed radar. The first layer can be of a thickness to optimize internal reflection utilizing the quarter wavelength rule. The second layer can aid in dissipating energy by at least two mechanisms. The impinging radar can be absorbed, in part, and the energy converted to electrical or heat energy. The impinging radar can also be reflected back to the first layer which is internally reflective, resulting in dissipation of the radar energy as heat.

In some embodiments, composites of the invention can include a plurality of additional layers between the first layer and second layer. These intermediate layers can be provided as a stepped gradient of increasing CNT density on the CNT-infused fiber material from the first layer down to the second layer. In other embodiments, these intermediate layers can be provided as a continuous gradient of increasing CNT density on the CNT-infused fiber material from the first layer down to the second layer.

In some embodiments, the first layer and the second layer can be separate CNT-infused fiber materials. That is separate lengths of two continuous fiber materials. This provides diversity of potential composition for the fiber material. For example, in some embodiments, the first layer can include a CNT-infused glass fiber material, while in other embodiments, the second layer can include a CNT-infused carbon fiber material. The inner most layers of the composite structure can benefit from utilizing a fiber material that has its own conducting properties. This can aid in dissipation of the absorbed radar energy.

One skilled in the art will recognize that in applications related to radar absorption for signature control, it is desirable to manufacture materials that absorb and/or transmit radar while avoiding radar reflection at the surface of the object. From a mechanistic standpoint, radar absorbing applications benefit from the absorption characteristics provided by the presence of the CNT-infused fiber material and the ability to minimize radar reflectance at lower CNT densities.

The radar absorbing composite materials include CNT-infused fiber materials that are typically constructed by infusing CNTs on "continuous" or "spoolable" lengths of a fiber material such as a tow, roving, fabric, or the like. The radar absorption capacity can vary depending on, for example, CNT length, CNT density, and CNT orientation. The processes by which CNT-infused fiber materials are made allow for the construction of radar absorbing composites with well-defined absorption capability. The CNT length and orientation on the fiber material is controlled in the CNT growth process described herein below. The relative orientation of the CNTs in the composite is in turn controlled by the composite manufacturing process which orients the CNT-infused fiber.

The radar absorbing composite materials of the invention can be constructed to absorb one or more radar bands. In some embodiments, a single spoolable length of CNT-infused fiber can be provided that has differing lengths and orientations of CNTs along different sections of the single spoolable length in order to maximize absorption of different radar frequency bands. Alternatively, multiple spoolable lengths of fiber material with differing CNT lengths and/or orientations can be disposed in the composite material for the same effect. Either strategy provides layers within a composite with differing radar absorption characteristics. The multiple orientations for the CNTs also allow the radar absorbing composite to absorb electromagnetic radiation from multiple radar sources impinging at different incident angles on the composite material.

The dense packing of CNTs in the second or innermost layers of the composite can provide percolation pathways to effectively dissipate the energy of the absorbed radar electromagnetic radiation. Without being bound by theory, this can be the result of CNT-to-CNT point contact or CNT-to-CNT interdigitation as exemplified in FIGS. 7-9. In some embodiments, the absorbed radar energy in the CNTs can be transformed into electrical signals that can be integrated with a computer system to modulate the orientation of an article that incorporates the radar absorbing composite, such as a panel, to maximize radar absorption in response to a radar transmitting source or in a reflected EM wave in detection applications, for example. The second or innermost layers can also internally reflect the radar and dissipate the energy as heat.

In some embodiments, the radar absorbing composite material is provided as integral part of an entire article or structure used in stealth applications. In other embodiments, the radar absorbing material can be provided in a portion of the overall composite structure. For example a composite structure can have a surface "skin" that incorporates CNT-infused fiber material to absorb radar. In other embodiments, the radar absorbing composite material can be applied as a coating, for example as a chopped fiber mixed in coating matrices, on an already existing surface of another composite or other article. In such embodiments, the coating employs long lengths of fiber material which helps prevent chipping and the like as might occur with conventional coatings. Moreover, when employed as a coating a radar transparent overcoating can be used to further protect the radar absorbing composite material. Also when used as a "coating" the matrix of the CNT-infused fiber composite can closely match or be identical to the bulk matrix of the overall structure to provide superior bonding.

CNT-infused fiber materials of the radar absorbing composite materials are provided in which the CNTs are substantially uniform in length. This provides an overall composite product with reliable absorption properties across large sections. In the continuous process described herein for the production of CNT-infused fiber materials, the residence time of the fiber material in a CNT growth chamber can be modulated to control CNT growth and ultimately, CNT length. This provides a means to control specific properties of the CNTs grown. CNT length can also be controlled through modulation of the carbon feedstock and carrier gas flow rates and reaction temperature. Additional control of the CNT properties can be obtained by controlling, for example, the size of the catalyst used to prepare the CNTs. For example, 1 nm transition metal nanoparticle catalysts can be used to provide SWNTs in particular. Larger catalysts can be used to prepare predominantly MWNTs.

Additionally, the CNT growth processes employed are useful for providing a CNT-infused fiber material with uniformly distributed CNTs on the fiber materials while avoiding bundling and/or aggregation of the CNTs that can occur in processes in which pre-formed CNTs are suspended or dispersed in a solvent solution and applied by hand to the fiber material. Such aggregated CNTs tend to adhere weakly to a fiber material and the characteristic CNT properties are weakly expressed, if at all. In some embodiments, the maximum distribution density, expressed as percent coverage, that is, the surface area of fiber covered, can be as high as about 55% assuming about 8 nm diameter CNTs with 5 walls. This coverage is calculated by considering the space inside the CNTs as being "fillable" space. Various distribution/density values can be achieved by varying catalyst dispersion on the surface as well as controlling gas composition and process speed. Typically for a given set of parameters, a percent coverage within about 10% can be achieved across a fiber surface. Higher density and shorter CNTs are useful for improving mechanical properties, while longer CNTs with lower density are useful for improving thermal and electrical properties and radar absorption, although increased density is still favorable. A lower density can result when longer CNTs are grown. This can be the result of the higher temperatures and more rapid growth causing lower catalyst particle yields.

CNTs useful for infusion to the fiber materials include single-walled CNTs, double-walled CNTs, multi-walled CNTs, and mixtures thereof. The exact CNTs to be used depends on the end-use application of the radar absorbing composite material. CNTs can be used for thermal and/or electrical conductivity applications, in addition to radar absorption. In some embodiments, the infused carbon nanotubes are single-wall nanotubes. In some embodiments, the infused carbon nanotubes are multi-wall nanotubes. In some embodiments, the infused carbon nanotubes are a combination of single-wall and multi-wall nanotubes. There are some differences in the characteristic properties of single-wall and multi-wall nanotubes that, for some end uses of the fiber, dictate the synthesis of one or the other type of nanotube. For example, single-walled nanotubes can be semi-conducting or metallic, while multi-walled nanotubes are metallic. Thus, if it can be desirable to control the CNT type if the absorbed radar is to be converted into, for example, and electrical signal that can integrate with a computer system.

CNTs lend their characteristic properties such as mechanical strength, low to moderate electrical resistivity, high thermal conductivity, and the like to the CNT-infused fiber material. For example, in some embodiments, the electrical resistivity of a carbon nanotube-infused carbon fiber material is lower than the electrical resistivity of a parent fiber material. More generally, the extent to which the resulting CNT-infused fiber expresses these characteristics can be a function of the extent and density of coverage of the carbon fiber by the carbon nanotubes. These properties can also be transferred to the overall radar absorbing composite in which they are incorporated. Any amount of the fiber surface area, from 0-55% of the fiber can be covered assuming an 8 nm diameter, 5-walled MWNT (again this calculation counts the space inside the CNTs as finable). This number is lower for smaller diameter CNTs and more for greater diameter CNTs. 55% surface area coverage is equivalent to about 15,000 CNTs/micron$^2$. Further CNT properties can be imparted to the carbon fiber material in a manner dependent on CNT length. Infused CNTs can vary in length ranging from between about 1 micron to about 500 microns, including 1 micron, 2 microns, 3 microns, 4 micron, 5, microns, 6, microns, 7 microns, 8 microns, 9 microns, 10 microns, 15 microns, 20 microns, 25 microns, 30 microns, 35 microns, 40 microns, 45 microns, 50 microns, 60 microns, 70 microns, 80 microns, 90 microns, 100 microns, 150 microns, 200 microns, 250 microns, 300 microns, 350 microns, 400 microns, 450 microns, 500 microns, and all values in between. CNTs can also be less than about 1 micron in length, including about 100 nanometers, for example. CNTs can also be greater than 500 microns, including for example, 510 microns, 520 microns, 550 microns, 600 microns, 700 microns and all values in between. For radar absorbing applications, the CNTs can vary in length from between about 5 to about 250 microns.

Radar absorbing composite materials of the invention can incorporate CNTs have a length from about 100 nanometers to about 10 microns. Such CNT lengths can be useful in application to increase shear strength. CNTs can also have a length from about 5 to about 70 microns. Such CNT lengths can be useful in applications for increased tensile strength if the CNTs are aligned in the fiber direction. CNTs can also have a length from about 10 microns to about 100 microns. Such CNT lengths can be useful to increase electrical/thermal properties as well as mechanical properties. The process used in the invention can also provide CNTs having a length from about 100 microns to about 500 microns, which can also be beneficial to increase electrical and thermal properties. A composite composed of a plurality of materials with the above CNT lengths is beneficial to radar absorption.

Thus, the CNT-infused fiber material is multifunctional and can enhance many other properties of the overall radar absorbing composite. In some embodiments, composites that include spoolable lengths of CNT-infused fiber materials can have various uniform regions with different lengths of CNTs. For example, it can be desirable to have a first portion of CNT-infused carbon fiber material with uniformly shorter CNT lengths to enhance shear strength properties, and a second portion of the same spoolable material with a uniform longer CNT length to enhance radar absorption properties. For example, mechanical enhancement can be achieved by providing at least a portion of the radar absorbing composite material with shorter CNTs, as described above, in a CNT-infused fiber material. The composite can take the form of a skin having longer CNTs at the surface of the radar absorbing composite for radar absorption and shorter CNTs disposed below the surface for mechanical strengthening. The control of CNT length is readily achieved through modulation of carbon feedstock and inert gas flow rates coupled with varying linespeeds and growth temperature. This can vary the CNT length in different sections of the same spoolable length of fiber material or different spools can be employed and the different spools incorporated in the appropriate portion of the composite structure.

Radar absorbing composite materials of the present invention include a matrix material to form the composite with the CNT-infused fiber material. Such matrix materials can include, for example, an epoxy, a polyester, a vinylester, a polyetherimide, a polyetherketoneketone, a polyphthalamide, a polyetherketone, a polyetherketone, a polyimide, a phenol-formaldehyde, and a bismaleimide. Matrix materials useful in the present invention can include any of the known matrix materials (see Mel M. Schwartz, Composite Materials Handbook (2 d ed. 1992)). Matrix materials more generally can include resins (polymers), both thermosetting and thermoplastic, metals, ceramics, and cements.

Thermosetting resins useful as matrix materials include phthalic/maelic type polyesters, vinyl esters, epoxies, phenolics, cyanates, bismaleimides, and nadic end-capped polyimides (e.g., PMR-15). Thermoplastic resins include polysulfones, polyamides, polycarbonates, polyphenylene oxides, polysulfides, polyether ether ketones, polyether sulfones, polyamide-imides, polyetherimides, polyimides, polyarylates, and liquid crystalline polyester.

Metals useful as matrix materials include alloys of aluminum such as aluminum 6061, 2024, and 713 aluminum braze. Ceramics useful as matrix materials include carbon ceramics, such as lithium aluminosilicate, oxides such as alumina and mullite, nitrides such as silicon nitride, and carbides such as silicon carbide. Cements useful as matrix materials include carbide-base cermets (tungsten carbide, chromium carbide, and titanium carbide), refractory cements (tungsten-thoria and barium-carbonate-nickel), chromium-alumina, nickel-magnesia iron-zirconium carbide. Any of the above-described matrix materials can be used alone or in combination. Ceramic or metal matrix composites can be used in high temperature applications such as thrust vectoring surfaces which can benefit from signature control materials.

In some embodiments, the radar absorbing composite can further include a plurality of transition metal nanoparticles. These transition metal nanoparticles can be present as latent catalyst from the CNT growth procedure in some embodiments. Without being bound by theory, transition metal NPs, which serve as a CNT-forming catalyst, can catalyze CNT growth by forming a CNT growth seed structure. The CNT-forming catalyst can remain at the base of the fiber material, locked by a barrier coating (vide infra), if present, and infused to the surface of the fiber material. In such a case, the seed structure initially formed by the transition metal nanoparticle catalyst is sufficient for continued non-catalyzed seeded CNT growth without allowing the catalyst to move along the leading edge of CNT growth, as often observed in the art. In such a case, the NP serves as a point of attachment for the CNT to the fiber material. The presence of a barrier coating can also lead to further indirect bonding motifs for CNT infusion. For example, the CNT forming catalyst can be locked into a barrier coating, as described above, but not in surface contact with fiber material. In such a case a stacked structure with the barrier coating disposed between the CNT forming catalyst and fiber material results. In either case, the CNTs formed are infused to the fiber material. In some embodiments, some barrier coatings will allow the CNT growth catalyst to follow the leading edge of the growing nanotube. In such cases, this can result in direct bonding of the CNTs to the fiber material or, optionally, to a barrier coating. Regardless of the nature of the actual bonding motif formed between the carbon nanotubes and the fiber material, the infused CNT is robust and allows the CNT-infused fiber material to exhibit carbon nanotube properties and/or characteristics.

In the absence of a barrier coating the latent CNT growth particles can appear at the base of the carbon nanotube, at the tip of the nanotube, anywhere in between, and mixtures thereof. Again, the infusion of the CNT to the fiber material can be either direct or indirect via the intervening transition metal nanoparticle. In some embodiments, the latent CNT growth catalyst includes iron nanoparticles. These may be of varying oxidation state including, for example, zero-valent iron, iron (II), iron (III), and mixtures thereof The presence of latent iron based nanoparticles from CNT growth can further aid the radar absorption property of the overall composite material.

In some embodiments, the CNT-infused fiber can be passed through an iron, ferrite, or iron-based nanoparticle solution post growth. CNTs can absorb large quantities of iron nanoparticles which can further aid in signature control. Thus, this additional processing step provides supplemental iron nanoparticles for improved radar absorption by mechanisms analogous to iron ball paint.

Radar absorbing composite materials of the invention can absorb radar across the entire spectrum of radar frequency bands. In some embodiments, the composite materials can absorb high frequency radar. High frequency (HF) radar bands have frequencies in a range from between about 3 to about 30 MHz (10-100 m). This radar band is useful in coastal radar and over-the-horizon radar (OTH) radar applications. In some embodiments, the composite materials can absorb radar in the P-band. This includes radar frequencies less than about 300 MHz. In some embodiments, the composite materials can absorb radar in the very high frequency band (VHF). VHF radar bands have frequencies in a range from between about 30 to about 330 MHz. The VHF band is useful in applications that are very long range, including, ground penetrating applications. In some embodiments, the composite materials can absorb radar in the ultra high frequency (UHF) band. The UHF band includes frequencies in a range from between about 300 to about 1000 MHz. Applications of the UHF band include very long range applications, such as ballistic missile early warning systems, ground penetrating and foliage penetrating applications. In some embodiments, the composite materials can absorb radar in the long (L) band. The L-band includes frequencies in a range from between about 1 to about 2 GHz. The L-band can be useful in long range applications including, for example, air traffic control and surveillance. In some embodiments, the composite materials can absorb radar in the short (S)-band. The S-band includes frequencies in a range from between about 2 to about 4 GHz. The S-band can be useful in applications such as terminal air traffic control, long-range weather, and marine radar. In some embodiments, the composite material can absorb radar in the C-band which has frequencies in a range from between about 4 to about 8 GHz. The C-band has been used in satellite transponders and in weather applications. In some embodiments, the composite material can absorb radar in the X-band which has frequencies that range from between about 8 to about 12 GHz 2. The X-band is useful in applications such as missile guidance, marine radar, weather, medium-resolution mapping and ground surveillance. In some embodiments, the composite material can absorb radar in the K-band which includes frequencies between about 12 to about 18 GHz. The K-band can be used for detecting clouds by meteorologists, and used by police for detecting speeding motorists employing K-band radar guns. In some embodiments, the composite materials absorbs radar in the $K_a$-band which includes frequencies from between about 24 to about 40 GHz. The $K_a$-band can be used in photo radar, such as those used to trigger cameras at traffic signals.

In some embodiments, the composite material absorbs radar in the millimeter (mm) band which is broadly between about 40 to about 300 GHz. The mm-band includes the Q-band from between about 40 to about 60 GHz which is used in military communication, the V-band from between about 50 to about 75 GHz, which is strongly absorbed by atmospheric oxygen, the E-band from between about 60 to about 90 GHz, the W-band from between about 75 to about 110 GHz, which is used as a visual sensor for experimental autonomous vehicles, high-resolution meteorological observation, and imaging, and the UWB-band from between about 1.6 to about 10.5 GHz, which is used for through-the-wall radar and imaging systems.

In some embodiments, the composite material includes CNTs present in a range between about 1% by weight to about 5% by weight of the radar absorbing composite material. In some embodiments, CNT loading can be between about 1% to about 20% by weight of the radar absorbing composite material. In some embodiments, CNT loading in the radar absorbing composite can be 1%, 2%, 3%, 4%, 5%, 6%, 7%, 8%, 9%, 10%, 11%, 12%, 13%, 14%, 15%, 16%, 17%, 18%, 19%, and 20% by weight of the radar absorbing composite, including any fraction in between these values. CNT loading in the radar absorbing composite can also be less than 1% including for example between about 0.001% to about 1%. CNT loading the radar absorbing composite can also be greater than 20% including, for example, 25%, 30%, 40%, and so on up to about 60% and all values in between.

In some embodiments, a radar absorbing composite includes a carbon nanotube (CNT)-infused carbon fiber material. The CNT-infused carbon fiber material can include a carbon fiber material of spoolable dimensions, a barrier coating conformally disposed about the carbon fiber material, and carbon nanotubes (CNTs) infused to the carbon fiber material. The infusion of CNTs to the carbon fiber material can include a bonding motif of direct bonding of individual CNTs to the carbon fiber material or indirect bonding via a transition metal NP, barrier coating, or both.

CNT-infused carbon fiber materials of the invention can include a barrier coating. Barrier coatings can include for example an alkoxysilane, methylsiloxane, an alumoxane, alumina nanoparticles, spin on glass and glass nanoparticles. The CNT-forming catalyst can be added to the uncured barrier coating material and then applied to the carbon fiber material together. In other embodiments the barrier coating material can be added to the carbon fiber material prior to deposition of the CNT-forming catalyst. The barrier coating material can be of a thickness sufficiently thin to allow exposure of the CNT-forming catalyst to the carbon feedstock for subsequent CVD growth. In some embodiments, the thickness is less than or about equal to the effective diameter of the CNT-forming catalyst. In some embodiments, the thickness of the barrier coating is in a range from between about 10 nm to about 100 nm. The barrier coating can also be less than 10 nm, including 1 nm, 2 nm, 3 nm, 4 nm, 5 nm, 6 nm, 7 nm, 8 nm, 9 nm, 10 nm, and any value in between.

Without being bound by theory, the barrier coating can serve as an intermediate layer between the carbon fiber material and the CNTs and can provide mechanical infusion of the CNTs to the carbon fiber material. Such mechanical infusion still provides a robust system in which the carbon fiber material serves as a platform for organizing the CNTs while still imparting properties of the CNTs to the carbon fiber material. Moreover, the benefit of including a barrier coating is the immediate protection it provides the carbon fiber material from chemical damage due to exposure to moisture and/or any thermal damage due to heating of the carbon fiber material at the temperatures used to promote CNT growth.

When growing CNTs on carbon fiber materials, the elevated temperatures and/or any residual oxygen and/or moisture that can be present in the reaction chamber can damage the carbon fiber material. Moreover, the carbon fiber material itself can be damaged by reaction with the CNT-forming catalyst itself That is the carbon fiber material can behave as a carbon feedstock to the catalyst at the reaction temperatures employed for CNT synthesis. Such excess carbon can disturb the controlled introduction of the carbon feedstock gas and can even serve to poison the catalyst by overloading it with carbon. The barrier coating employed in the invention is designed to facilitate CNT synthesis on carbon fiber materials. Without being bound by theory, the coating can provide a thermal barrier to heat degradation and/or can be a physical barrier preventing exposure of the carbon fiber material to the environment at the elevated temperatures. Alternatively or additionally, it can minimize the surface area contact between the CNT-forming catalyst and the carbon fiber material and/or it can mitigate the exposure of the carbon fiber material to the CNT-forming catalyst at CNT growth temperatures.

There are three types of carbon fiber which are categorized based on the precursors used to generate the fibers, any of which can be used in the invention: Rayon, Polyacrylonitrile (PAN) and Pitch. Carbon fiber from rayon precursors, which are cellulosic materials, has relatively low carbon content at about 20% and the fibers tend to have low strength and stiffness. Polyacrylonitrile (PAN) precursors provide a carbon fiber with a carbon content of about 55%. Carbon fiber based on a PAN precursor generally has a higher tensile strength than carbon fiber based on other carbon fiber precursors due to a minimum of surface defects.

Pitch precursors based on petroleum asphalt, coal tar, and polyvinyl chloride can also be used to produce carbon fiber. Although pitches are relatively low in cost and high in carbon yield, there can be issues of non-uniformity in a given batch.

In some embodiments, the CNT-infused fiber material includes a glass fiber material. CNT-infused glass fiber materials need not incorporate a barrier coating as described above, although one can be optionally employed. The glass-type used in the glass fiber material can be any type, including for example, E-glass, A-glass, E-CR-glass, C-glass, D-glass, R-glass, and S-glass. E-glass includes alumino-borosilicate glass with less than 1% by weight alkali oxides and is mainly used for glass-reinforced plastics. A-glass includes alkali-lime glass with little or no boron oxide. E-CR-glass includes alumino-lime silicate with less than 1% by weight alkali oxides and has high acid resistance. C-glass includes alkali-lime glass with high boron oxide content and is used, for example, for glass staple fibers. D-glass includes borosilicate glass and possesses a high dielectric constant. R-glass includes alumino silicate glass without MgO and CaO and possesses high mechanical strength. S-glass includes alumino silicate glass without CaO but with high MgO content and possesses high tensile strength. One or more of these glass types can be processed into the glass fiber materials described above. In particular embodiments, the glass is E-glass. In other embodiments, the glass is S-glass.

In some embodiments, if the CNT-infused fiber material includes a ceramic fiber material. Like glass, the use of a barrier coating is optional when using ceramic fiber materials. The ceramic-type used in a ceramic fiber material can be any type, including for example, oxides such as alumina and zirconia, carbides, such as boron carbide, silicon carbide, and tungsten carbide, and nitrides, such as boron nitride and silicon nitride. Other ceramic fiber materials include, for example, borides and silicides. Ceramic fibers can also include basalt fiber materials. Ceramic fiber materials may occur as composite materials with other fiber types. It is common to find fabric-like ceramic fiber materials that also incorporate glass fiber, for example.

The CNT-infused fiber materials can include a fiber material based on a filament, a yarn, a tow, a tape, a fiber-braid, a woven fabric, a non-woven fiber mat, a fiber ply, and other 3D woven structures. Filaments include high aspect ratio fibers having diameters ranging in size from between about 1 micron to about 100 microns. Fiber tows are generally compactly associated bundles of filaments and are usually twisted together to give yarns.

Yarns include closely associated bundles of twisted filaments. Each filament diameter in a yarn is relatively uniform. Yarns have varying weights described by their 'tex,' expressed as weight in grams of 1000 linear meters, or denier, expressed as weight in pounds of 10,000 yards, with a typical tex range usually being between about 200 tex to about 2000 tex, although this value will depend on the exact fiber material being used.

Tows include loosely associated bundles of untwisted filaments. As in yarns, filament diameter in a tow is generally uniform. Tows also have varying weights and the tex range is usually between 200 tex and 2000 tex. They are frequently characterized by the number of thousands of filaments in the tow, for example 12K tow, 24K tow, 48K tow, and the like. Again these values vary depending on the type of fiber material being employed.

Tapes are materials that can be assembled as weaves or can represent non-woven flattened tows. Tapes can vary in width and are generally two-sided structures similar to ribbon. Processes of the present invention are compatible with CNT infusion on one or both sides of a tape. CNT-infused tapes can resemble a "carpet" or "forest" on a flat substrate surface. Again, processes of the invention can be performed in a continuous mode to functionalize spools of tape.

Fiber-braids represent rope-like structures of densely packed carbon fibers. Such structures can be assembled from yarns, for example. Braided structures can include a hollow portion or a braided structure can be assembled about another core material.

In some embodiments a number of primary fiber material structures can be organized into fabric or sheet-like structures. These include, for example, woven fabrics, non-woven fiber mat and fiber ply, in addition to the tapes described above. Such higher ordered structures can be assembled from parent tows, yarns, filaments or the like, with CNTs already infused in the parent fiber. Alternatively such structures can serve as the substrate for the CNT infusion processes described herein.

Figure 2:
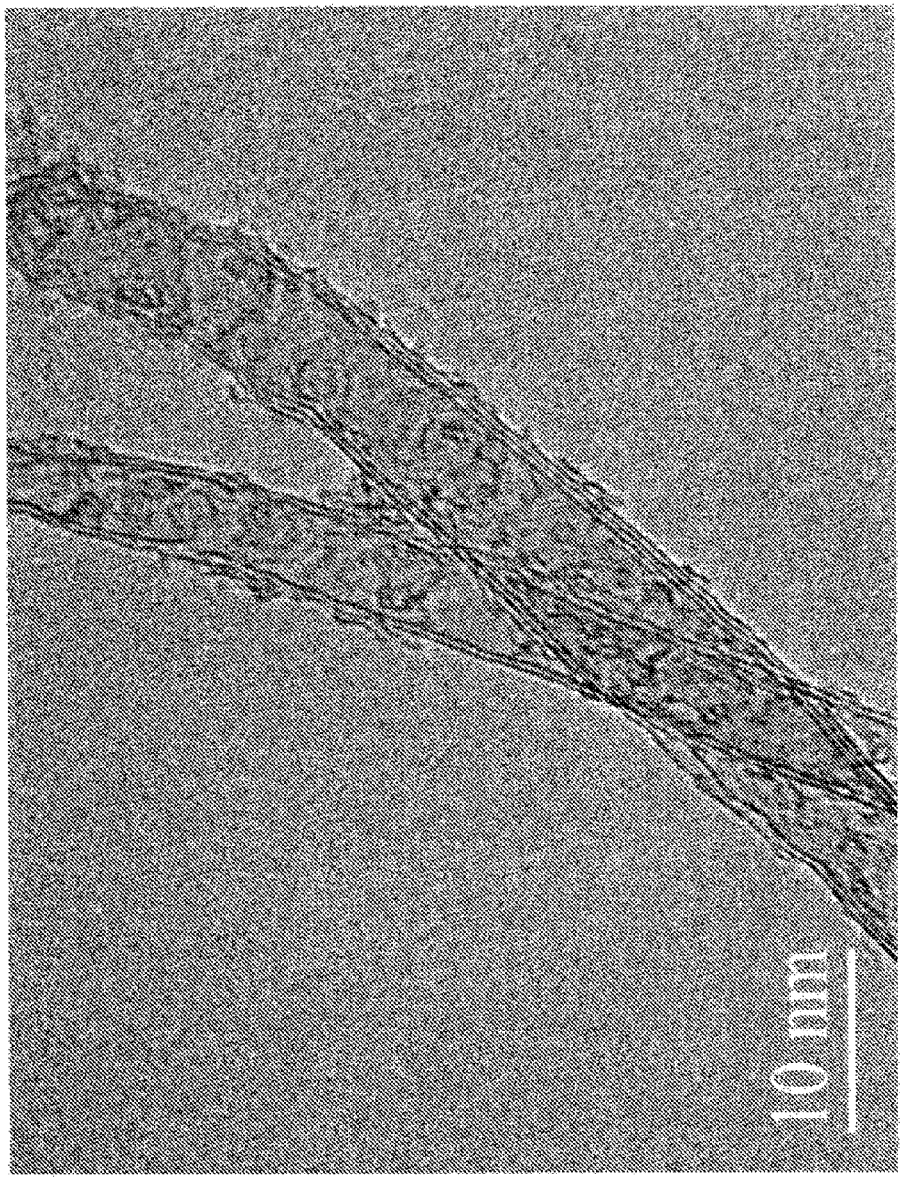
FIG. 2 shows a TEM image of a double-walled CNT (DWNT) grown on AS4 carbon fiber via a continuous CVD process.
Figure 3:
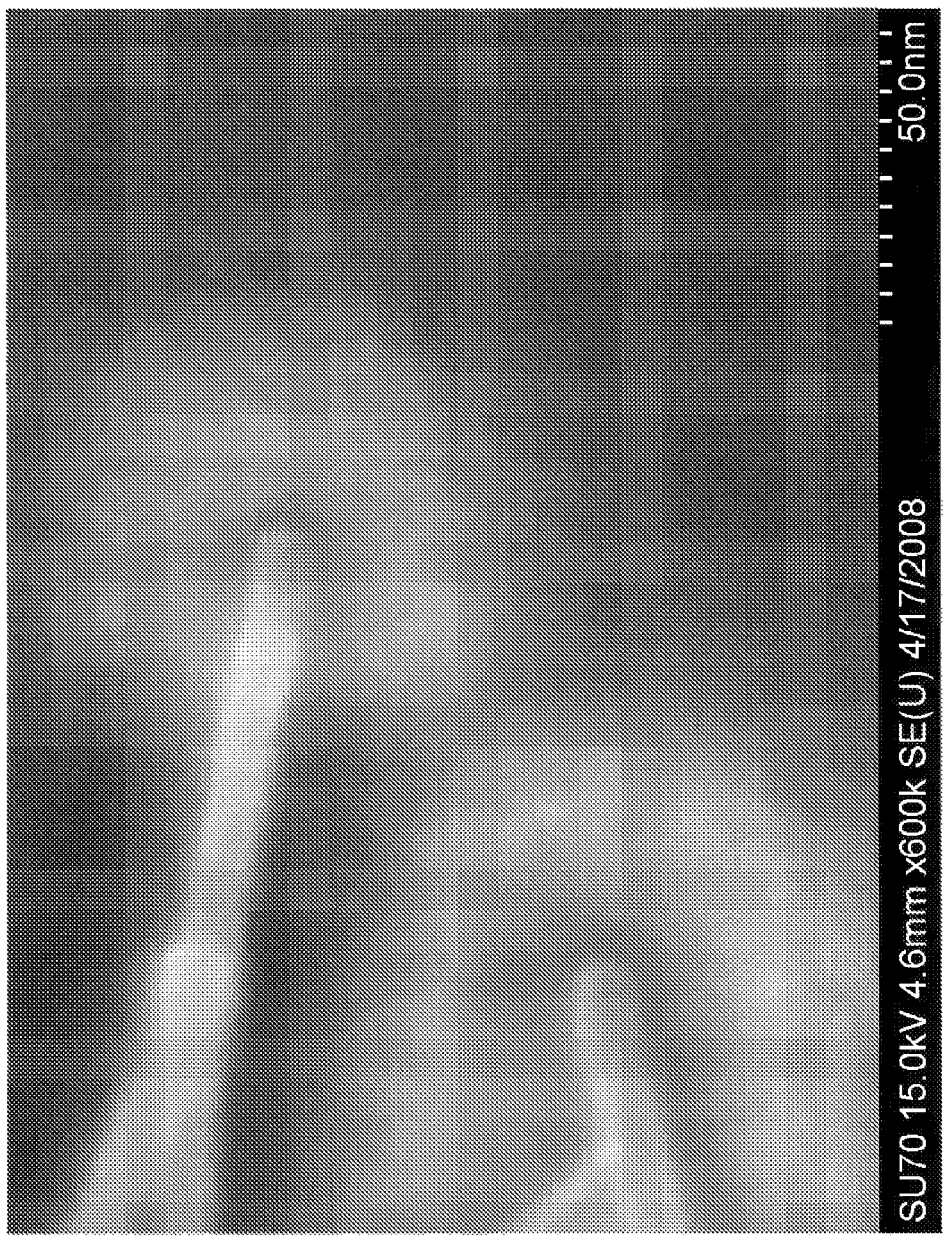
FIG. 3 shows a scanning electron microscope (SEM) image of CNTs growing from within the barrier coating where the CNT-forming nanoparticle catalyst was mechanically infused to the carbon fiber material surface.
Figure 4:
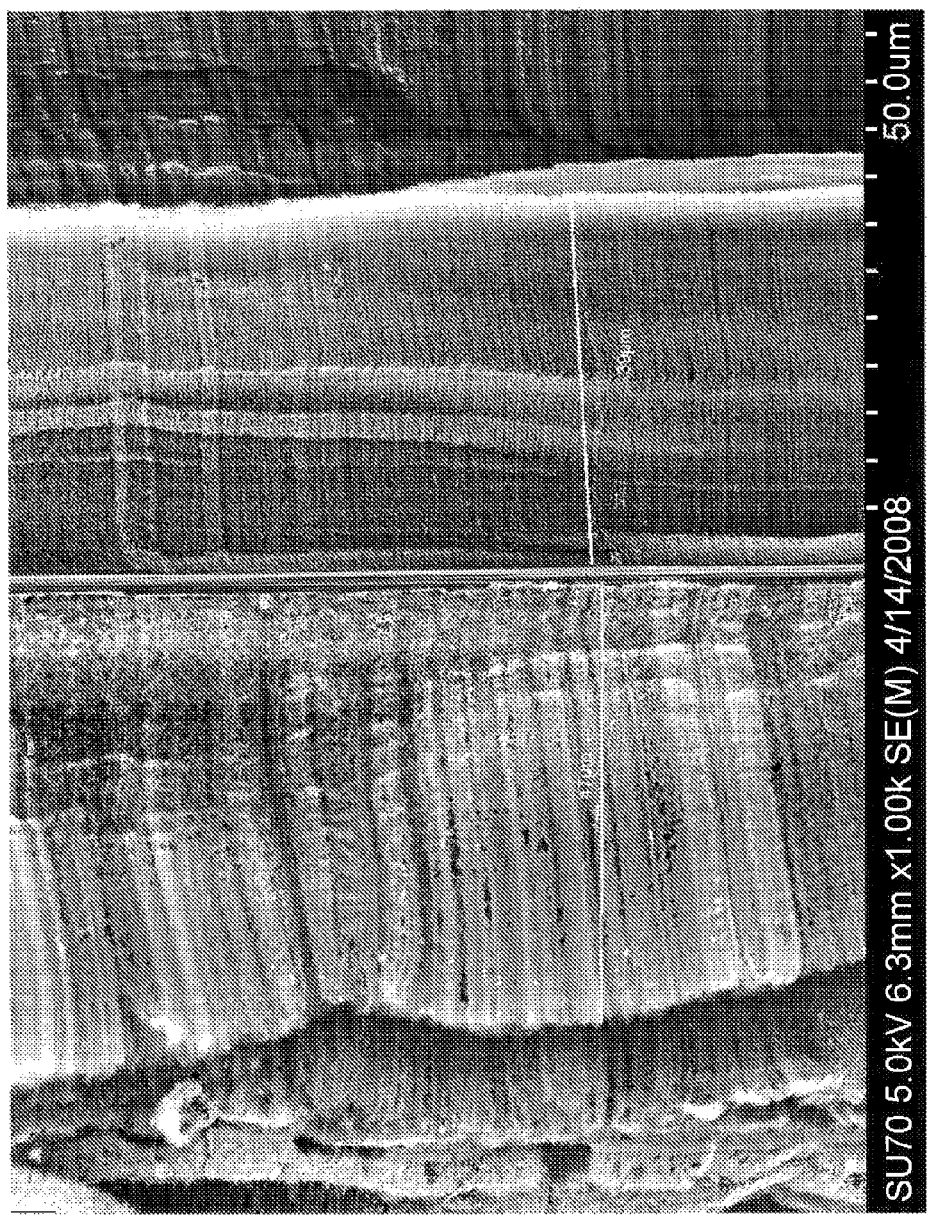
FIG. 4 shows a SEM image demonstrating the consistency in length distribution of CNTs grown on a carbon fiber material to within 20% of a targeted length of about 40 microns.
Figure 5:
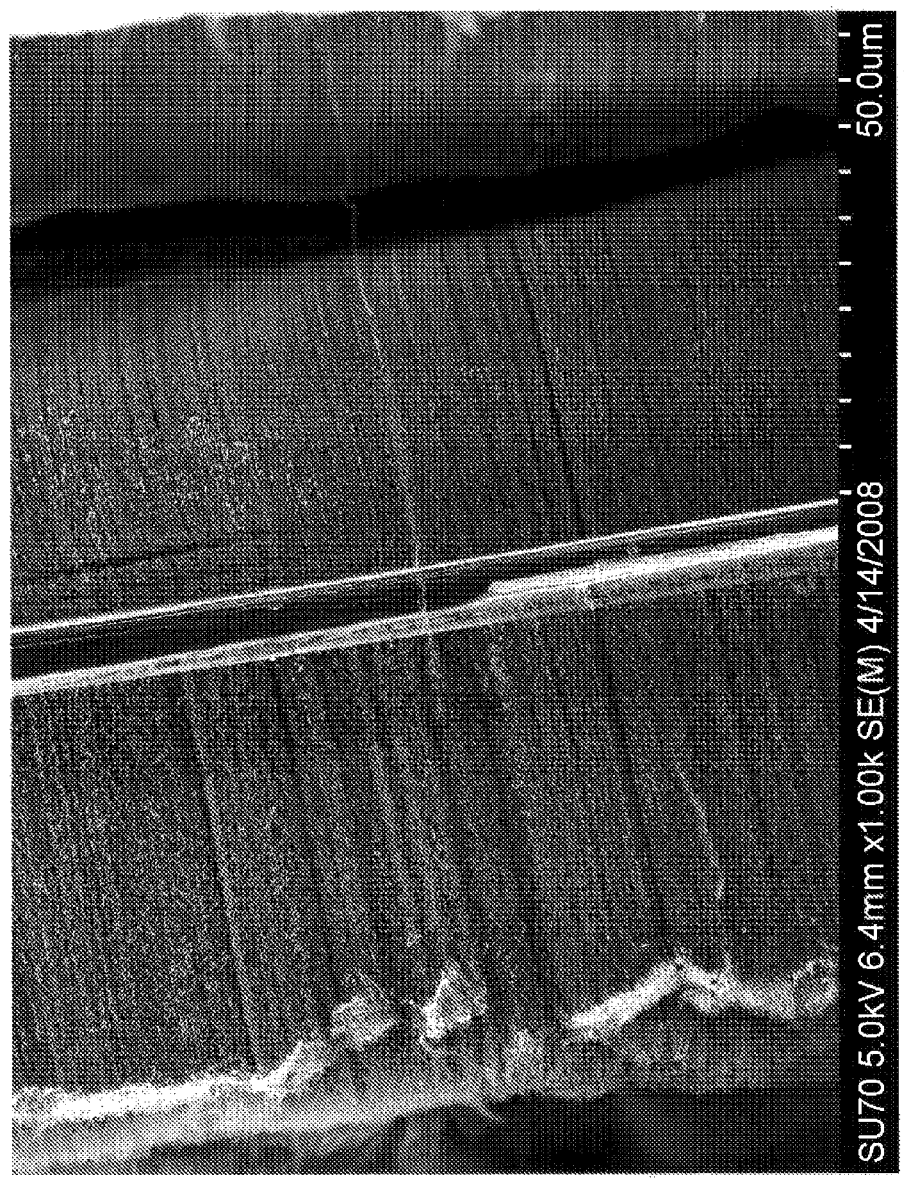
FIG. 5 shows an SEM image demonstrating the effect of a barrier coating on CNT growth. Dense, well aligned CNTs grew where barrier coating was applied and no CNTs grew where barrier coating was absent.
Figure 6:
FIG. 6 shows a low magnification SEM of CNTs on carbon fiber demonstrating the uniformity of CNT density across the fibers within about 10%.

FIG. 1-6 shows TEM and SEM images of CNTs prepared on carbon fiber materials prepared by the processes described herein. The procedures for preparing these materials are further detailed below and in Examples I-III. These Figures and procedures exemplify the process for carbon fiber materials, however, one skilled in the art will recognize that other fiber materials can be employed, such as glass or ceramic, without significantly departing from these processes. FIGS. 1 and 2 show TEM images of multi-walled and double-walled carbon nanotubes, respectively, that were prepared on an AS4 carbon fiber in a continuous process. FIG. 3 shows a scanning electron microscope (SEM) image of CNTs growing from within the barrier coating after the CNT-forming nanoparticle catalyst was mechanically infused to a carbon fiber material surface. FIG. 4 shows a SEM image demonstrating the consistency in length distribution of CNTs grown on a carbon fiber material to within 20% of a targeted length of about 40 microns. FIG. 5 shows an SEM image demonstrating the effect of a barrier coating on CNT growth. Dense, well aligned CNTs grew where barrier coating was applied and no CNTs grew where barrier coating was absent. FIG. 6 shows a low magnification SEM of CNTs on carbon fiber demonstrating the uniformity of CNT density across the fibers within about 10%.

Figure 7:
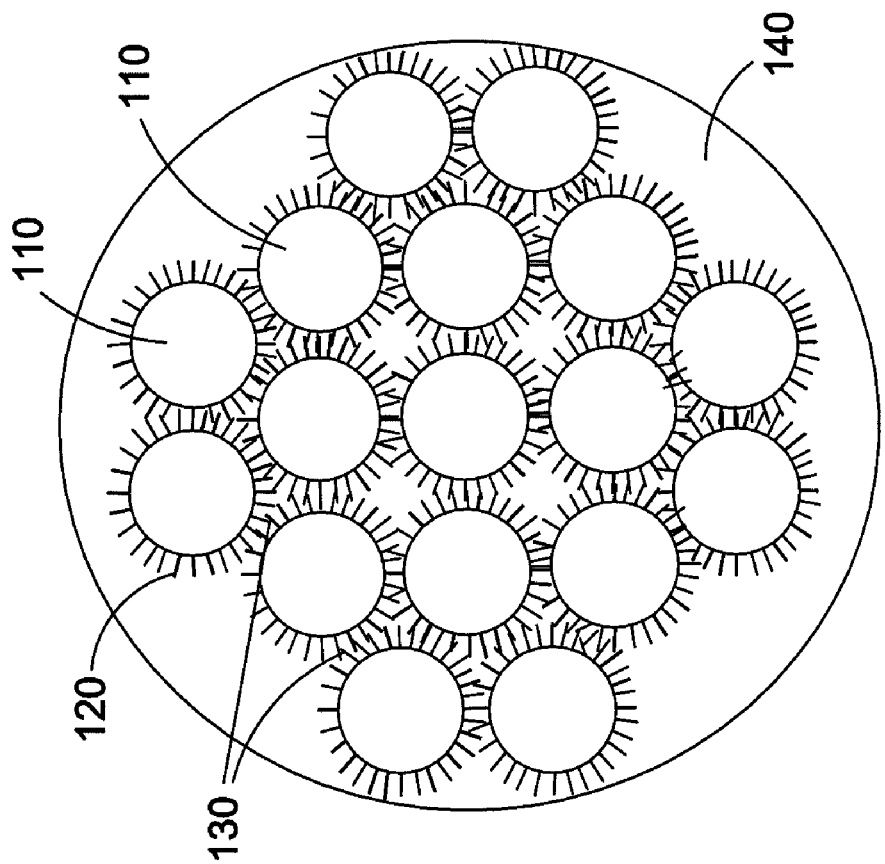
FIG. 7 shows a cross-section of a radar absorbing composite material having a carbon nanotube (CNT)-infused fiber material.

Referring now to FIG. 7, there is illustrated schematically a cross-sectional view of a composite material 100, according to some embodiments of the invention. Composite material 100 is suitable for fabricating structures, for example aircraft components, having desirable radar absorbing characteristics. Composite material 100 includes a plurality of fibers or filaments 110, such as in a tow or roving, that might be present in a matrix 140. Fibers 110 are infused with carbon nanotubes 120. In an exemplary embodiment, fibers 110 may be glass (e.g., E-glass, S-glass, D-glass) fibers. In another embodiment, fibers 110 may be carbon (graphite) fibers. Other fibers such as polyamide (Aromatic polyamide, Aramid) (e.g., Kevlar 29 and Kevlar 49), metallic fiber (e.g., steel, aluminum, molybdenum, tantalum, titanium, copper, and tungsten), tungsten monocarbide, ceramic fiber, metallic-ceramic fiber (e.g., aluminum silica), cellulosic fiber, polyester, quartz, and silicon carbide may also be used. CNT synthesis processes described herein with regard to carbon fibers can be used for CNT synthesis on any fiber type. In some embodiments, the metallic fibers can be coated with an appropriate barrier coating before applying the catalyst particles thereto, to prevent undesirable chemical reaction between the catalyst particles and the metallic fibers such as alloying. Thus, when employing metallic fiber materials, the process can parallel that used for carbon fiber materials. Similarly, the thermal sensitive aramid fibers can also employ a barrier coating to protect the fiber material from the typical temperature employed during CNT growth.

In an exemplary embodiment, carbon nanotubes 120 may be grown generally perpendicularly from the outer surface of fiber 110, thereby providing a radial coverage to each individual fiber 110. Carbon nanotubes 120 may be grown in situ on fibers 110. For example, a glass fiber 110 may be fed through a growth chamber maintained at a given temperature of about 500° to 750° C. Carbon containing feed gas can then be introduced into the growth chamber, wherein carbon radicals dissociate and initiate formation of carbon nanotubes on the glass fiber, in presence of the catalyst nanoparticles.

Figure 13:
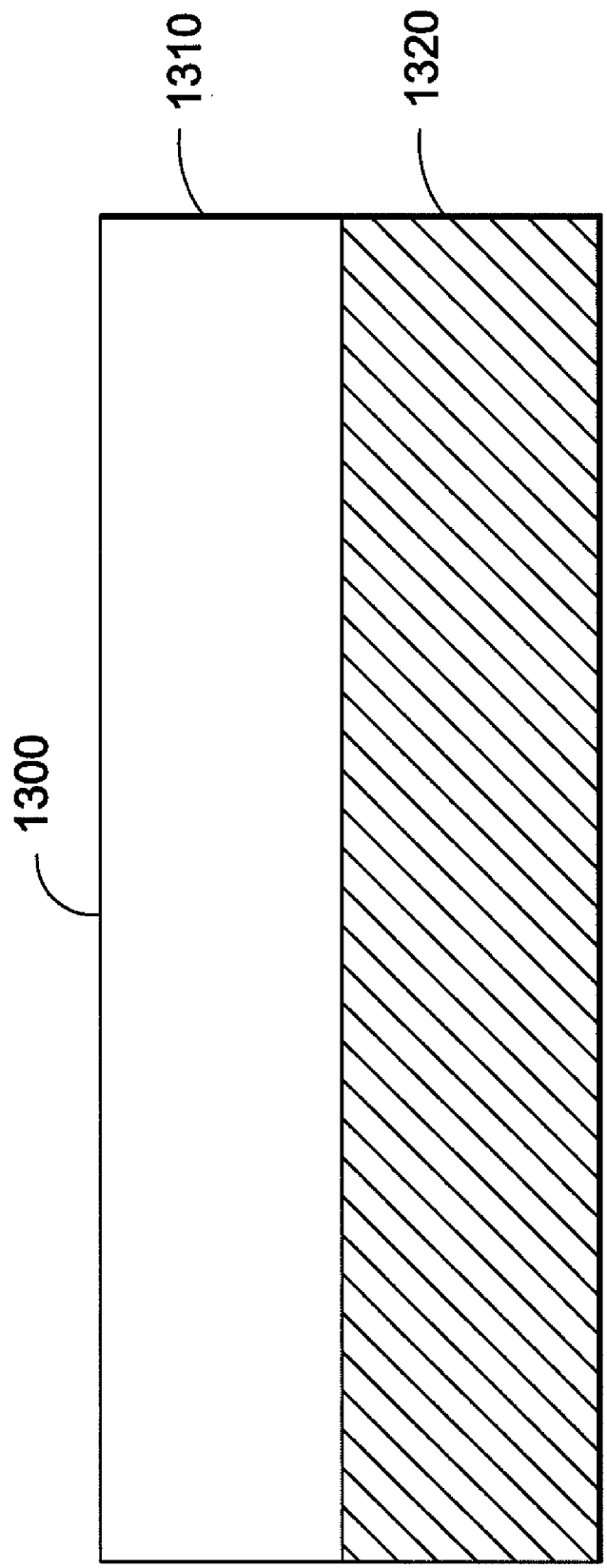
FIG. 13 shows a cross section of an exemplary RAM panel having a bilayer structure that includes CNT-infused fiber materials.

FIG. 13 shows an exemplary RAM panel 1300, in accordance with the present invention. RAM panel 1300 represents a cross section of CNT-infused fiber-based radar absorbing material. First layer 1310 is in contact with the incoming EM waves (radar) and has a dielectric constant similar to air. First layer 1310 can be a glass fiber composite material in some embodiments. The thickness of first layer 1310 is sized in order to take advantage of the quarter wavelength rule given the refractive index of the second layer 1320 which is a heavily loaded CNT-infused fiber material. CNT quantities of 1%-60% can be targeted in this structure depending on the specific EM frequency of interest and the resulting refractive index desired. The high CNT content provides a high dielectric constant, a more conductive material, which will reflect incoming EM waves. These reflected waves, with properly sized first layer 1310 will internally reflect and dissipate as heat.

Figure 14:
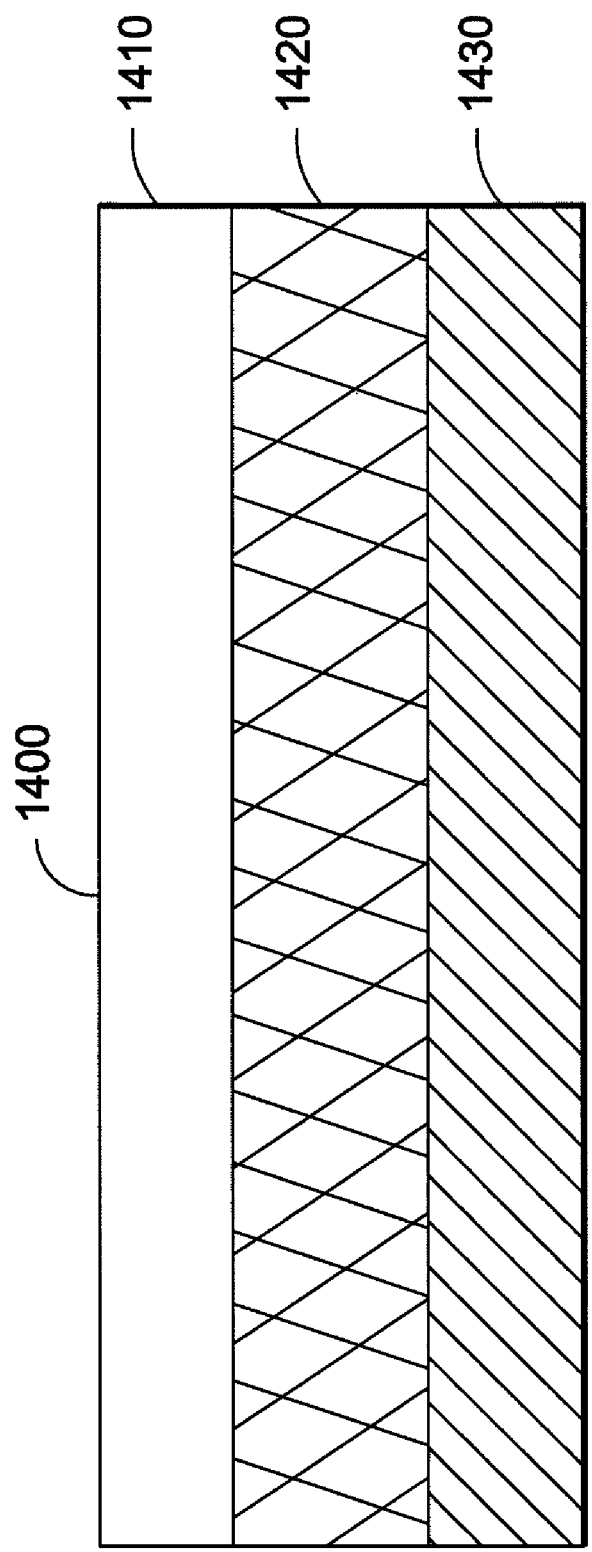
FIG. 14 shows a cross section of an exemplary RAM panel having a multi-layered structure that includes CNT-infused fiber materials.

FIG. 14 shows another exemplary RAM panel 1400. RAM panel 1400 represents a cross section of a multi-layered CNT-infused fiber based radar absorbing material. Such embodiments use varying amounts of CNTs in each successive layer to induce internal reflection and EM wave (radar) dissipation of multiple frequencies using one panel structure. RAM panel 1400 has a first layer 1410, which is exposed to the incident EM wave, intermediate layer 1420, and a second layer 1430. It will be apparent to one skilled in the art that intermediate layer 1420 can exist as any number of multiple intermediate layers with increasing CNT content moving from the first layer to the second layer. Continuing in this fashion, first layer 1410 has a dielectric constant similar to air to allow for wave transmittance. As a result, this material has low % CNTs between 0-1% CNTs by weight in the composite structure. First layer 1410 is sized such that its thickness takes advantage of the quarter wavelength theory for total internal reflection which is dependent on the incoming frequency of the EM wave and the index of refraction of intermediate layer 1420. Intermediate layer 1420 consists of CNT weight % 0.1-5% in composite and are similarly sized depending on refractive characteristics of second layer 1430 or any successive intermediate layers used as well as the frequencies of interest. Second layer 1430 consists of the highest weight % CNTs, between 1-60% and is sized similarly to the first layer and intermediate layers. Second layer 1430 is typically maximally loaded with CNTs to provide the most reflective surface.

In some embodiments, the CNTs are infused on a fiber material in a continuous density gradient along the fiber. Such embodiments are analogous to that shown in FIG. 14. A continuous gradient RAM structure uses a continuously variable amount of CNTs on a fiber material such that the resulting wound structure contains tailored and constantly varying amounts of CNTs at specific depths targeted at absorbing and internally reflecting EM waves more evenly across the entire spectrum of interest. A continuously variable structure can provide the ability to create a highly effective radar absorbing material across a broad spectrum instead of a RAM that targets specific peaks. This is made possible by layered arrangements as described in FIG. 14.

In one configuration, to create composite material 100, CNT-infused fiber 110 is delivered to a resin bath. In another configuration, a fabric may be woven from CNT-infused fibers 110 and the fabric subsequently delivered to a resin bath. The resin bath can contain any resin for the production of composite material 100 comprising CNT-infused fibers 110 and matrix 140. In one configuration, matrix 140 may take the form of an epoxy resin matrix. In another configuration, matrix 140 may be one of general purpose polyester (such as orthophthalic polyesters), improved polyester (such as isophthalic polyesters), phenolic resin, bismaleimide (BMI) resin, polyurethane, and vinyl ester. Matrix 140 can also take the form of a non-resin matrix (for example, a ceramic matrix) useful for applications requiring performance at higher operational temperatures, such as aerospace and/or military applications. It will be understood that matrix 140 can also take the form of a metal matrix.

Known composite manufacturing methods such as vacuum assisted resin infusion method and resin extrusion method for impregnating CNT-infused fibers 110, or a fabric woven therefrom, with a resin matrix may be applied. For example, CNT-infused fibers 110, or a fabric thereof, may be laid in a mold and resin may be infused therein. In another configuration, CNT-infused fibers 110, or a fabric thereof, may be laid in a mold, which is then evacuated to pull the resin therethrough. In another configuration, CNT-infused fibers 110 may be woven in a "0/90" orientation by winding. This may be accomplished, for example, by winding a first layer or panel of CNT-infused fibers 100 in a first direction, such as the vertical direction, and then winding a second layer or panel of CNT-infused fibers 110 in a second direction, such as the horizontal direction, which is about 90° to the first direction. Such a "0/90" orientation can impart additional structural strength to composite material 100.

Fibers 110 infused with carbon nanotubes 120 can be incorporated in a thermoset plastic matrix (e.g., an epoxy resin matrix) 140 to create composite material 100. The methods for incorporating fibers in a matrix are well known in the art. In one configuration, CNT-infused fibers 110 can be incorporated in matrix 140 using a high pressure curing method. CNT loading of a composite signifies the weight percentage of carbon nanotubes in a given composite. Processes known in the art for producing CNT-based composites involve direct mixing of loose (i.e. not bound to spoolable length fibers) carbon nanotubes into the resin/matrix of the nascent composite. The composites resulting from such processes are can be limited to a maximum of about five (5) weight percent of carbon nanotubes in the finished composite material due to factors such as prohibitive viscosity increases. Composite material 100, on the other hand, may have a CNT loading in excess of 25 weight %, as described herein above. Using CNT-infused fibers 110, composite materials having CNT loading as high as 60 weight percent have been demonstrated. The radar absorbing characteristic of a material can depend, in part, on its electrical conductivity. Overall electrical conductivity of composite 100 is, in part, a function of the CNT loading of composite 100.

The above-described composite material 100 with CNT-infused fibers incorporated therein is suitable for fabricating components with electromagnetic or radar absorbing characteristics, for aircrafts, and submarines, for example. It has been demonstrated that composite material 100 effectively absorbs electromagnetic radiation in the radar spectrum, including infrared (about 700 nm to about 15 centimeters), visible (about 400 nm to about 700 nm) and ultraviolet (about 10 nm to about 400 nm) radiation.

Composite structures which are desirable, for example, for their weight and strength characteristics, are sometimes not suitable for fabricating aircraft components because of their relatively poor signature control, or radar absorbing characteristics. For example, carbon fiber composites are generally reflective of radar waves and therefore have relatively poor signature control. Glass fiber composites, on the other hand, are generally transparent to radar waves. However, they are generally dielectric in nature and have poor electrical and thermal conductivities. Incorporation of CNTs in carbon fiber composites and glass fiber composites effectively enhances radar wave absorptivity of the resulting composite materials. In the case of glass fiber composites, incorporated CNTs also improve thermal and electrical conductivities of the resulting composite materials. Composite 100 with CNT-infused fibers 110, thus, enhances the signature control characteristics, while retaining the desirable characteristics such as low weight to strength ratio associated with composite materials. The effectiveness of a composite material as a radar absorbent can be adjusted by tailoring the weight percentage of carbon nanotubes in the composite material. Without being bound by theory, the incorporated CNTs can absorb radar waves in a fashion similar to iron nanoparticles used in iron ball paints.

Figure 8:
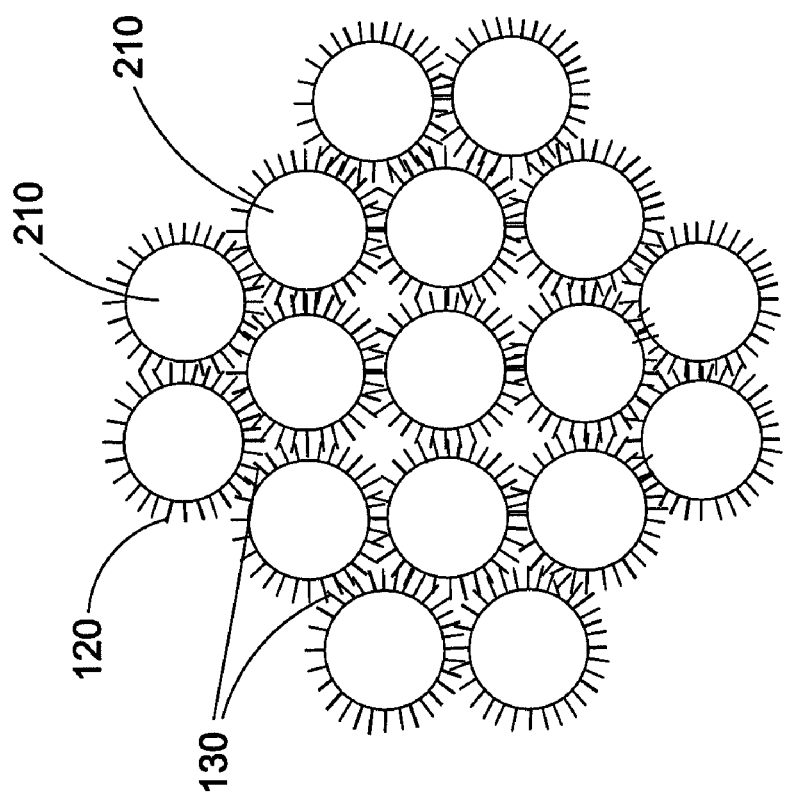
FIG. 8 shows a carbon nanotube-infused fiber tow adapted to be used as a radar absorbing material coating on an article such as a panel.

Referring now to FIG. 8, a cross-sectional view of a CNT-infused fiber material 200 is schematically illustrated. Fiber material 200 can optionally include a matrix. Regardless of the existence of a matrix material, CNT-infused fiber material 200 can be applied to a surface of a previously fabricated composite material to significantly enhance radar absorbing or signature control characteristics of the composite material. In some embodiments, the pre-fabricated composite material, on its own, can exhibit poor signature control. However, the CNT-infused fiber material disposed on its surface can impart a sufficient degree of radar absorbing capacity to provide good signature control. CNT-infused fiber material 200 can be wound or woven about the pre-fabricated composite material. In some embodiments, where a matrix material was not previously present with CNT-infused fiber material 200 prior to disposing it on the composite material, one can be added after it is disposed thereon. Moreover, the matrix material added thusly can be of the same matrix as the pre-fabricated material, or of similar characteristics to promote strong bonding.

CNT-infused fiber material 200 includes a plurality of fibers in a fiber material 210, such as a tow or roving. Carbon nanotubes 120 are infused to fiber material 210. Van der Waals forces between closely-situated groups of carbon nanotubes 120 can provide a significant increase in the interaction between CNTs 120. In some embodiments, this can result in CNT "interdigitation" of carbon nanotubes 120, which can provide a filament-to-filament bond or adhesion. In an exemplary embodiment, the interdigitation of carbon nanotubes 120 may be further induced by applying pressure to fiber material 210 in order to consolidate CNT-infused fiber material 200. This filament-to-filament bond can enhance the formation of fiber tows, tapes, and weaves in the absence of a resin matrix. This filament-to-filament bond can also increase shear and tensile strengths, relative to a filament-resin bond as might be employed in conventional fiber tow composites. Composite fiber materials formed from such CNT-infused fiber tows exhibit good signature control and/or radar absorbing characteristics along with increased interlaminar shear strength, tensile strength, and out-of-axis strength. In some embodiments, the CNTs need not be fully interdigitated to provide beneficial radar absorbing characteristics. For example, percolation pathways can be created by simple point contact between CNTs.

In one configuration, CNT-infused fiber materials 200 can be applied as a coating on a surface of a conventional composite material, such as a glass fiber composite panel or a carbon fiber composite panel, to impart good signature control characteristics to such conventional composite material. In one configuration, CNT-infused fiber materials 200 may be wound around a composite structure to enhance radar absorbing or signature control characteristics of the composite structure. A coating of a matrix, such as a resin matrix, can be applied over one or more layers of CNT-infused fiber materials 200, or a fabric woven therefrom, applied to a surface of the composite material to protect CNT-infused composite fibers 200 from external environment. Multiple layered CNT-infused fiber materials can be disposed to provide multiple CNT orientations, lengths, and densities to vary the radar absorption characteristics to absorb radar in different frequency bands and to absorb radar from sources that impinge the overall structure from different angles.

Figure 9:
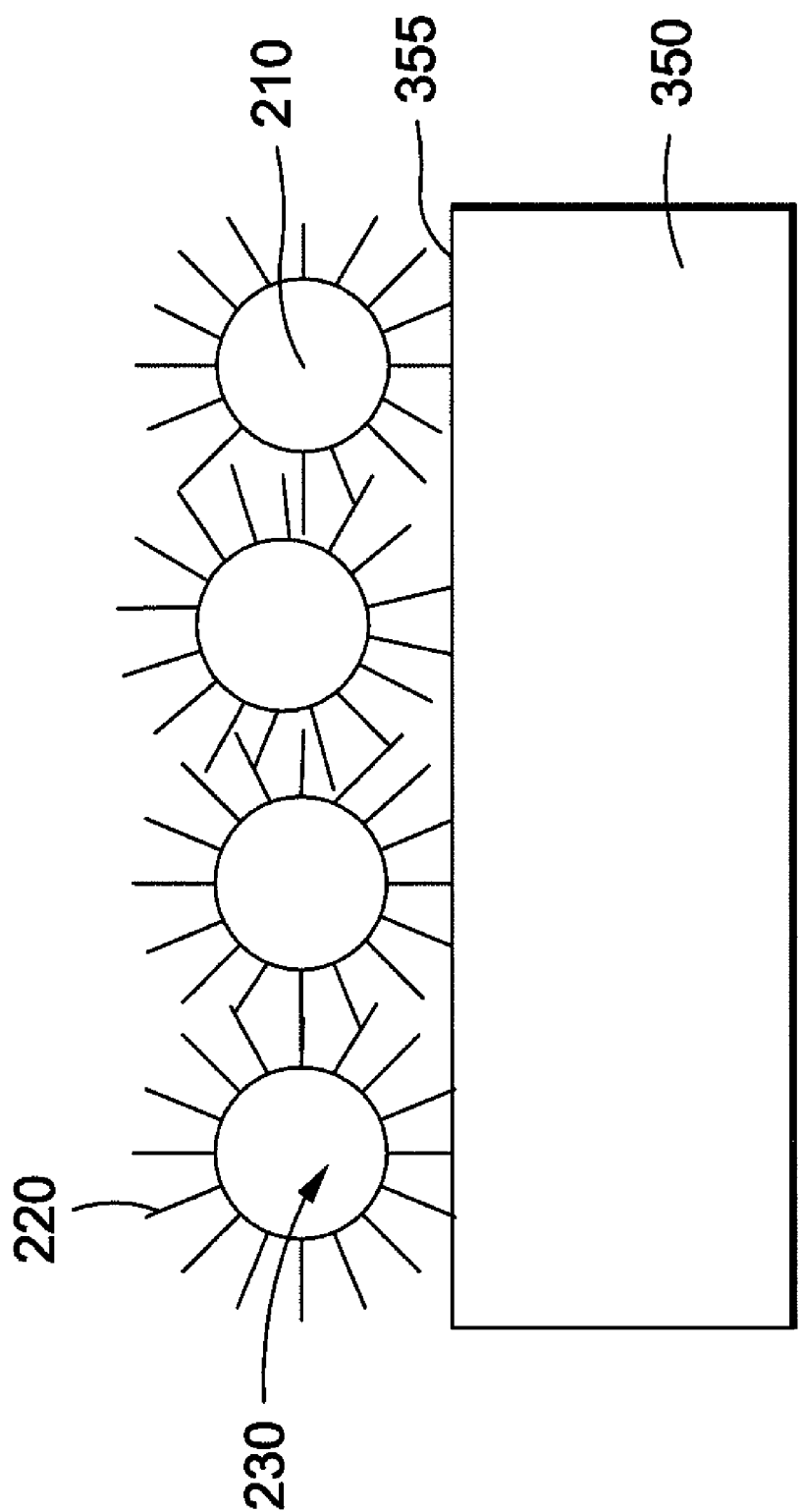
FIG. 9 shows a carbon nanotube-infused fiber tow coating applied on a composite to improve the radar absorbing characteristics of the composite.

Referring now to FIG. 9, there is illustrated schematically a coating layer of fiber material 210 with infused CNTs disposed on a top surface 355 of a composite material 350. Composite 350 may take the form of a conventional composite glass or glass-reinforced plastic, for example. In another configuration, composite 350 may take the form of a carbon fiber composite structure or a carbon fiber reinforced plastic structure. Composite 350, on its own, is generally not suitable for use in applications requiring good radar absorbing or signature control characteristics. However, by applying a coating or layer 230 of fiber material 210 having CNTs infused thereon, onto surface 355 of composite 350, the combination (i.e., the combination of composite 350 and CNT-infused fibers) exhibits significantly enhanced radar absorbing or signature control characteristics. In an exemplary embodiment, fibers 210 may be a fiber tow infused with carbon nanotubes 220 with a matrix, such as, a resin matrix. In yet another exemplary embodiment, fibers 210 may be woven to form a fabric, which may be applied to top surface 355 of composite material 350.

In some embodiments, CNT-infused fiber materials 200 may be woven to form a fabric. In one configuration, a coating of fibers can have a thickness ranging from about 20 nanometers (nm) for a single layer of CNT-infused fibers to about 12.5 mm for multiple layers of CNT-infused fibers. While the illustrated embodiment depicts a single layer of fibers for the sake of simplicity, it will be understood that multiple layers of fibers can be used to form a coating on composite 350.

An advantage of using CNT-infused fiber material 200 is that such a coating can be used in conjunction with conventional composite materials having poor radar absorbing or signature control characteristics for low observable applications while retaining advantages of the composite such as weight to strength ratios and other desirable mechanical and structural characteristics.

A layer or coating of CNT-infused fiber material 200 can be disposed on a surface of a composite structure such as the leading edges of wing structures of an aircraft to enhance the radar absorbing or signature control characteristics of the composite structure. Such a use of a layer or coating of CNT-infused fiber material 200 applied to a conventional composite material facilitates using conventional composite materials for fabrication, for example, a wing structure and other components of an aircraft, and reducing the weight of the aircraft significantly while simultaneously having low observable characteristics.

Figure 10:
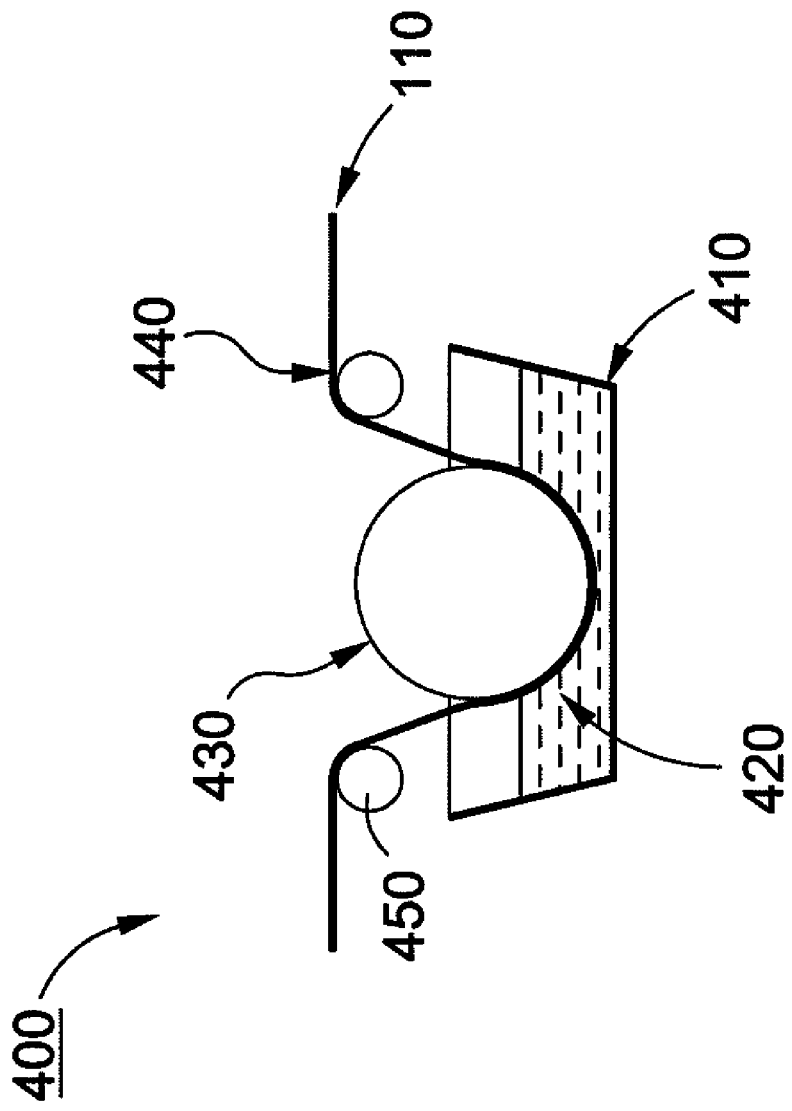
FIG. 10 shows a schematic diagram of a coating system for carbon nanotube-infused fibers.

Referring now to FIG. 10, there is illustrated a coating system 400, according to an exemplary embodiment. System 400 receives CNT-infused fiber 110 from an upstream fiber source. In an exemplary embodiment, CNT-infused fibers can be directed to coating system 400 directly from the growth chamber where carbon nanotubes 120 are infused onto the fiber material. CNT-infused fiber 110 is immersed in a chemical solution 420 contained in a bath 410 to further treat CNT-infused fiber 110. CNT-infused fiber 110 is guided by two guide rollers 440, 450. A bath roller 430 immerses CNT-infused fiber 110 into solution 420. In an exemplary embodiment, solution 420 is an iron-based nanoparticle solution. In one configuration, solution 420 includes 1 part volume iron based solute in 200 parts hexane solvent. Carbon nanotubes 120 on CNT-infused fiber 110 will absorb iron nanoparticles, thereby further enhancing radar absorbing or signature control characteristics of CNT-infused fiber 110 and any composite fabricated therefrom. It will be understood that broad band fabrics fabricated from CNT-infused fibers 110 may similarly be treated to incorporate iron based nanoparticles.

In some embodiments, the radar absorbing composite material can have CNTs infused on the fiber material in a controlled manner. For example, the CNTs may be grown in a dense radial display about individual fiber elements of the fiber material. In other embodiments, the CNTs can be processed further post growth to align directly along the fiber axis. In order to produce a CNT-Infused composite coating, a traditional fiber on the scale of 1-15 microns can be used as a surface for synthesis. Various surface modification techniques and additional coatings can be used to protect the fiber and/or improve fiber to catalyst interfaces. Catalyst coatings are applied via any number of spray, dip, and gas phase processes. Once a layer of catalyst has been deposited, catalyst reduction and CNT growth occur simultaneously during a CVD based growth process in a atmospheric pressure growth system, in situ continuously. After one layer of CNTs is grown, additional techniques, beyond those mentioned in the patent application, must be employed to align the radial (as grown) CNTs in the direction of the fiber. Three broadly described techniques as well as any combination of them can be used to achieve this alignment. These techniques are described as follows:

Electromechanical—Via the use of an electric or magnetic field aligned parallel to the fiber during the growth process, CNTs can be induced to align by way of the force field applied.

Mechanical—A variety of mechanical techniques including extrusion, pultrusion, gas pressure aided dies, conventional dies, and mandrels can be used to apply a shearing force in the direction of the fibers to induce alignment.

Chemical—Chemicals including solvents, surfactants, and micro-emulsions can be used to induce alignment via the sheathing effect in the direction of the fibers observed as material is drawn out of these chemicals.

Moreover, because the CNTs can have a defined orientation with respect to the fiber axis, the CNTs, in turn can have a controlled orientation within any overall composite structure made therefrom. This can be achieved in any of the winding and/or fabric processes described above, or by controlling orientation of the CNT-infused fiber material in the a resin matrix for curing or the like.

Thus, in some embodiments, the present invention provides a method of manufacturing these radar absorbing composite materials that includes 1) disposing a CNT-infused fiber material in a portion of a matrix material with a controlled orientation of the CNT-infused fiber material within the matrix material, and 2) curing the matrix material, wherein the controlled orientation of the CNT-infused fiber material controls the relative orientation of CNTs infused thereon.

Fibers can be incorporated into composites via wet winding, dry winding followed by vacuum assisted resin infusion, prepreg (resin in tacky form on fabric or fibers). In each case, the matrix is cured once the fibers and matrix are combined in a structure. Curing occurs under atmospheric, low pressure, or high pressure conditions.

In some embodiments, the present invention provides a panel that includes the radar absorbing composite materials of the invention. The panel can be made as a structural component of a transport vessel or projectile for use in stealth applications, in some embodiments. A transport vessel can include such a panel having the CNTs infused fiber material having CNTs in a controlled orientation within the composite material. The panel can be optionally equipped with a mechanism to adjust its angle with respect to an impinging angle of incidence of a radar transmitting source to maximize radar absorption. For example, the energy of the absorbed radar signal can be used to convert to an electrical signal which is integrated with a computer system to alter the orientation of the panel to maximize radar absorption. This can provide a means of optimizing against detection from multiple radar sources from previously unknown directions of impingement. In some embodiments, the transport vessel can take the form of a boat, a plane, and a ground vehicle, for example.

In some embodiments, the radar absorbing material can also be used to absorb radar in detector applications, where a reflected radar signal requires efficient capture. Thus, in addition to stealth application of not being detected. Radar absorbing composite materials of the present invention can be integrated into detection systems to more efficiently receive back reflected radar signals.

In some embodiments, radar absorbing materials of the invention can be incorporated in a projectile system. This can be achieved using a panel type system or coating as described above. In such applications the CNTs infused on the fiber material have a controlled orientation within the composite material and the panel or coating. When utilizing a panel, the panel can further be equipped with a mechanism to adjust its angle with respect to an impinging angle of incidence of a radar transmitting source to maximize radar absorption. In this way, a projectile can be made that can evade radar detection.

As described briefly above, the present invention relies on a continuous CNT infusion process to generate CNT-infused fiber materials. The process includes (a) disposing a carbon nanotube-forming catalyst on a surface of a fiber material of spoolable dimensions; and (b) synthesizing carbon nanotubes directly on the carbon fiber material, thereby forming a carbon nanotube-infused fiber material. Additional steps can be employed depending on the type of fiber material being used. For example, when using carbon fiber materials, a step that incorporates a barrier coating can be added to the process.

For a 9 foot long system, the linespeed of the process can range from between about 1.5 ft/min to about 108 ft/min. The linespeeds achieved by the process described herein allow the formation of commercially relevant quantities of CNT-infused fiber materials with short production times. For example, at 36 ft/min linespeed, the quantities of CNT-infused fibers (over 5% infused CNTs on fiber by weight) can exceed over 100 pound or more of material produced per day in a system that is designed to simultaneously process 5 separate tows (20 lb/tow). Systems can be made to produce more tows at once or at faster speeds by repeating growth zones. Moreover, some steps in the fabrication of CNTs, as known in the art, have prohibitively slow rates preventing a continuous mode of operation. For example, in a typical process known in the art, a CNT-forming catalyst reduction step can take 1-12 hours to perform. CNT growth itself can also be time consuming, for example requiring tens of minutes for CNT growth, precluding the rapid linespeeds realized in the present invention. The process described herein overcomes such rate limiting steps.

The CNT-infused carbon fiber material-forming processes of the invention can avoid CNT entanglement that occurs when trying to apply suspensions of pre-formed carbon nanotubes to fiber materials. That is, because pre-formed CNTs are not fused to the carbon fiber material, the CNTs tend to bundle and entangle. The result is a poorly uniform distribution of CNTs that weakly adhere to the carbon fiber material. However, processes of the present invention can provide, if desired, a highly uniform entangled CNT mat on the surface of the carbon fiber material by reducing the growth density. The CNTs grown at low density are infused in the carbon fiber material first. In such embodiments, the fibers do not grow dense enough to induce vertical alignment, the result is entangled mats on the carbon fiber material surfaces. By contrast, manual application of pre-formed CNTs does not insure uniform distribution and density of a CNT mat on the carbon fiber material.

Figure 11:
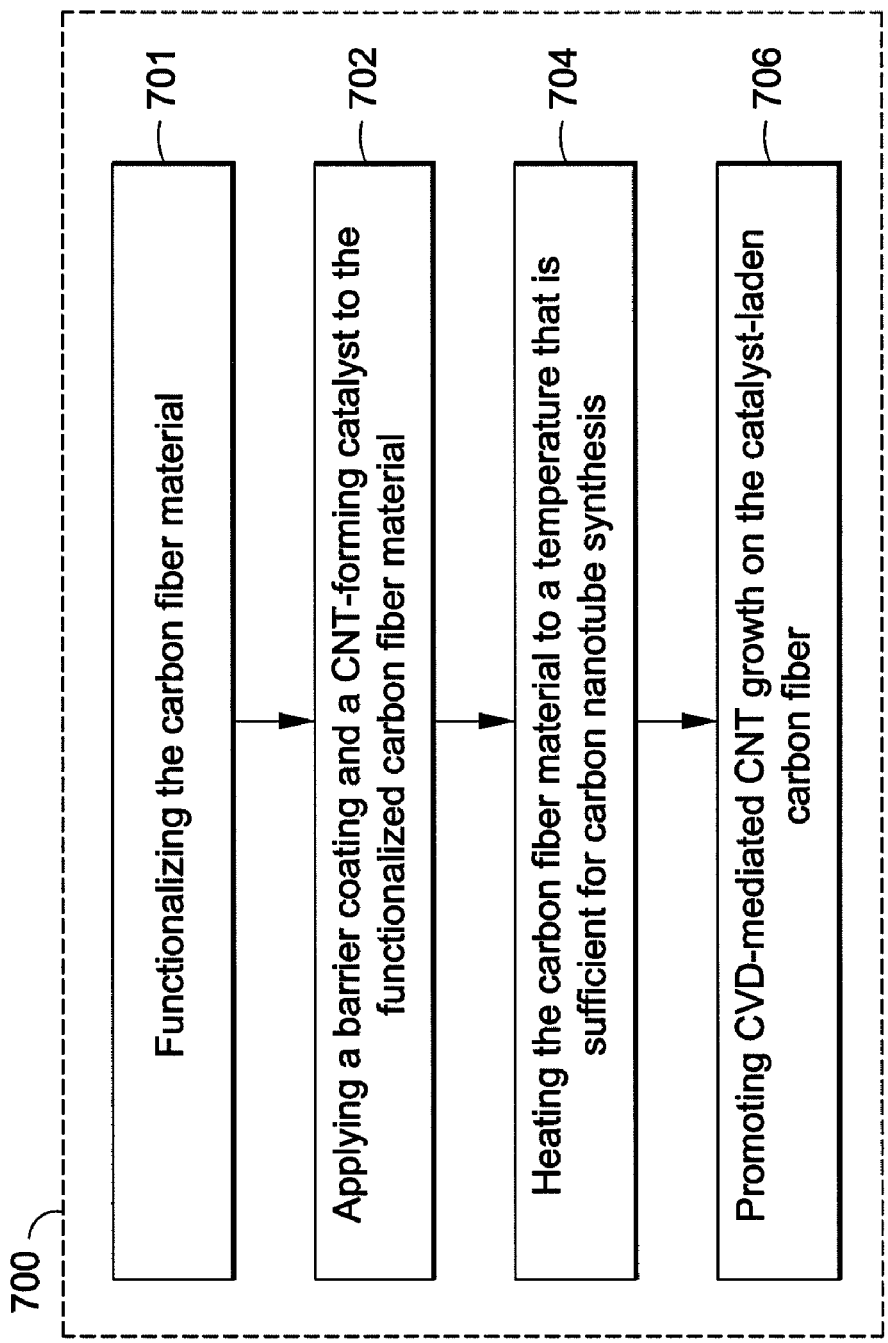
FIG. 11 shows a process for producing CNT-infused carbon fiber material in accordance with the illustrative embodiment of the present invention.

FIG. 11 depicts a flow diagram of process 700 for producing CNT-infused carbon fiber material in accordance with an illustrative embodiment of the present invention. One skilled in the art will recognize that slight variations in this process exemplifying CNT infusion on a carbon fiber material can be altered to provide other CNT-infused fiber materials such as glass or ceramic fibers, for example. Some such alterations in the conditions can include, for example, removing the step of applying a barrier coating, which is optional for glass and ceramics.

Process 700 includes at least the operations of:

701: Functionalizing the carbon fiber material.

702: Applying a barrier coating and a CNT-forming catalyst to the functionalized carbon fiber material.

704: Heating the carbon fiber material to a temperature that is sufficient for carbon nanotube synthesis.

706: Promoting CVD-mediated CNT growth on the catalyst-laden carbon fiber.

In step 701, the carbon fiber material is functionalized to promote surface wetting of the fibers and to improve adhesion of the barrier coating.

To infuse carbon nanotubes into a carbon fiber material, for example, the carbon nanotubes are synthesized on the carbon fiber material which is conformally coated with a barrier coating. In one embodiment, this is accomplished by first conformally coating the carbon fiber material with a barrier coating and then disposing nanotube-forming catalyst on the barrier coating, as per operation 702. In some embodiments, the barrier coating can be partially cured prior to catalyst deposition. This can provide a surface that is receptive to receiving the catalyst and allowing it to embed in the barrier coating, including allowing surface contact between the CNT forming catalyst and the carbon fiber material. In such embodiments, the barrier coating can be fully cured after embedding the catalyst. In some embodiments, the barrier coating is conformally coated over the carbon fiber material simultaneously with deposition of the CNT-form catalyst. Once the CNT-forming catalyst and barrier coating are in place, the barrier coating can be fully cured.

In some embodiments, the barrier coating can be fully cured prior to catalyst deposition. In such embodiments, a fully cured barrier-coated carbon fiber material can be treated with a plasma to prepare the surface to accept the catalyst. For example, a plasma treated carbon fiber material having a cured barrier coating can provide a roughened surface in which the CNT-forming catalyst can be deposited. The plasma process for "roughing" the surface of the barrier thus facilitates catalyst deposition. The roughness is typically on the scale of nanometers. In the plasma treatment process craters or depressions are formed that are nanometers deep and nanometers in diameter. Such surface modification can be achieved using a plasma of any one or more of a variety of different gases, including, without limitation, argon, helium, oxygen, nitrogen, and hydrogen. In some embodiments, plasma roughing can also be performed directly in the carbon fiber material itself. This can facilitate adhesion of the barrier coating to the carbon fiber material.

As described further below and in conjunction with FIG. 11, the catalyst is prepared as a liquid solution that contains CNT-forming catalyst that comprise transition metal nanoparticles. The diameters of the synthesized nanotubes are related to the size of the metal particles as described above. In some embodiments, commercial dispersions of CNT-forming transition metal nanoparticle catalyst are available and are used without dilution, in other embodiments commercial dispersions of catalyst can be diluted. Whether to dilute such solutions can depend on the desired density and length of CNT to be grown as described above.

With reference to the illustrative embodiment of FIG. 11, carbon nanotube synthesis is shown based on a chemical vapor deposition (CVD) process and occurs at elevated temperatures. The specific temperature is a function of catalyst choice, but will typically be in a range of about 500 to 1000° C. Accordingly, operation 704 involves heating the barrier-coated carbon fiber material to a temperature in the aforementioned range to support carbon nanotube synthesis.

In operation 706, CVD-promoted nanotube growth on the catalyst-laden carbon fiber material is then performed. The CVD process can be promoted by, for example, a carbon-containing feedstock gas such as acetylene, ethylene, and/or ethanol. The CNT synthesis processes generally use an inert gas (nitrogen, argon, helium) as a primary carrier gas. The carbon feedstock is provided in a range from between about 0% to about 15% of the total mixture. A substantially inert environment for CVD growth is prepared by removal of moisture and oxygen from the growth chamber.

In the CNT synthesis process, CNTs grow at the sites of a CNT-forming transition metal nanoparticle catalyst. The presence of the strong plasma-creating electric field can be optionally employed to affect nanotube growth. That is, the growth tends to follow the direction of the electric field. By properly adjusting the geometry of the plasma spray and electric field, vertically-aligned CNTs (i.e., perpendicular to the carbon fiber material) can be synthesized. Under certain conditions, even in the absence of a plasma, closely-spaced nanotubes will maintain a vertical growth direction resulting in a dense array of CNTs resembling a carpet or forest. The presence of the barrier coating can also influence the directionality of CNT growth.

The operation of disposing a catalyst on a carbon fiber material can be accomplished by spraying or dip coating a solution or by gas phase deposition via, for example, a plasma process. The choice of techniques can be coordinated with the mode with which the barrier coating is applied. Thus, in some embodiments, after forming a solution of a catalyst in a solvent, catalyst can be applied by spraying or dip coating the barrier coated carbon fiber material with the solution, or combinations of spraying and dip coating. Either technique, used alone or in combination, can be employed once, twice, thrice, four times, up to any number of times to provide a carbon fiber material that is sufficiently uniformly coated with CNT-forming catalyst. When dip coating is employed, for example, a carbon fiber material can be placed in a first dip bath for a first residence time in the first dip bath. When employing a second dip bath, the carbon fiber material can be placed in the second dip bath for a second residence time. For example, carbon fiber materials can be subjected to a solution of CNT-forming catalyst for between about 3 seconds to about 90 seconds depending on the dip configuration and linespeed. Employing spraying or dip coating processes, a carbon fiber material with a surface density of catalyst of less than about 5% surface coverage to as high as about 80% coverage, in which the CNT-forming catalyst nanoparticles are nearly monolayer. In some embodiments, the process of coating the CNT-forming catalyst on the carbon fiber material should produce no more than a monolayer. For example, CNT growth on a stack of CNT-forming catalyst can erode the degree of infusion of the CNT to the carbon fiber material. In other embodiments, the transition metal catalyst can be deposited on the carbon fiber material using evaporation techniques, electrolytic deposition techniques, and other processes known to those skilled in the art, such as addition of the transition metal catalyst to a plasma feedstock gas as a metal organic, metal salt or other composition promoting gas phase transport.

Because processes of the invention are designed to be continuous, a spoolable carbon fiber material can be dip-coated in a series of baths where dip coating baths are spatially separated. In a continuous process in which nascent carbon fibers are being generated de novo, dip bath or spraying of CNT-forming catalyst can be the first step after applying and curing or partially curing a barrier coating to the carbon fiber material. Application of the barrier coating and a CNT-forming catalyst can be performed in lieu of application of a sizing, for newly formed carbon fiber materials. In other embodiments, the CNT-forming catalyst can be applied to newly formed carbon fibers in the presence of other sizing agents after barrier coating. Such simultaneous application of CNT-forming catalyst and other sizing agents can still provide the CNT-forming catalyst in surface contact with the barrier coating of the carbon fiber material to insure CNT infusion.

The catalyst solution employed can be a transition metal nanoparticle which can be any d-block transition metal as described above. In addition, the nanoparticles can include alloys and non-alloy mixtures of d-block metals in elemental form or in salt form, and mixtures thereof. Such salt forms include, without limitation, oxides, carbides, and nitrides. Non-limiting exemplary transition metal NPs include Ni, Fe, Co, Mo, Cu, Pt, Au, and Ag and salts thereof and mixtures thereof. In some embodiments, such CNT-forming catalysts are disposed on the carbon fiber by applying or infusing a CNT-forming catalyst directly to the carbon fiber material simultaneously with barrier coating deposition. Many of these transition metal catalysts are readily commercially available from a variety of suppliers, including, for example, Ferrotec Corporation (Bedford, N.H.).

Catalyst solutions used for applying the CNT-forming catalyst to the carbon fiber material can be in any common solvent that allows the CNT-forming catalyst to be uniformly dispersed throughout. Such solvents can include, without limitation, water, acetone, hexane, isopropyl alcohol, toluene, ethanol, methanol, tetrahydrofuran (THF), cyclohexane or any other solvent with controlled polarity to create an appropriate dispersion of the CNT-forming catalyst nanoparticles. Concentrations of CNT-forming catalyst can be in a range from about 1:1 to 1:10000 catalyst to solvent. Such concentrations can be used when the barrier. coating and CNT-forming catalyst is applied simultaneously as well.

In some embodiments heating of the carbon fiber material can be at a temperature that is between about 500° C. and 1000° C. to synthesize carbon nanotubes after deposition of the CNT-forming catalyst. Heating at these temperatures can be performed prior to or substantially simultaneously with introduction of a carbon feedstock for CNT growth.

In some embodiments, the present invention provides a process that includes removing sizing agents from a carbon fiber material, applying a barrier coating conformally over the carbon fiber material, applying a CNT-forming catalyst to the carbon fiber material, heating the carbon fiber material to at least 500° C., and synthesizing carbon nanotubes on the carbon fiber material. In some embodiments, operations of the CNT-infusion process include removing sizing from a carbon fiber material, applying a barrier coating to the carbon fiber material, applying a CNT-forming catalyst to the carbon fiber, heating the fiber to CNT-synthesis temperature and CVD-promoted CNT growth the catalyst-laden carbon fiber material. Thus, where commercial carbon fiber materials are employed, processes for constructing CNT-infused carbon fibers can include a discrete step of removing sizing from the carbon fiber material before disposing barrier coating and the catalyst on the carbon fiber material.

The step of synthesizing carbon nanotubes can include numerous techniques for forming carbon nanotubes, including those disclosed in co-pending U.S. Patent Application No. US 2004/0245088 which is incorporated herein by reference. The CNTs grown on fibers of the present invention can be accomplished by techniques known in the art including, without limitation, micro-cavity, thermal or plasma-enhanced CVD techniques, laser ablation, arc discharge, and high pressure carbon monoxide (HiPCO). During CVD, in particular, a barrier coated carbon fiber material with CNT-forming catalyst disposed thereon, can be used directly. In some embodiments, any conventional sizing agents can be removed prior CNT synthesis. In some embodiments, acetylene gas is ionized to create a jet of cold carbon plasma for CNT synthesis. The plasma is directed toward the catalyst-bearing carbon fiber material. Thus, in some embodiments synthesizing CNTs on a carbon fiber material includes (a) forming a carbon plasma; and (b) directing the carbon plasma onto the catalyst disposed on the carbon fiber material. The diameters of the CNTs that are grown are dictated by the size of the CNT-forming catalyst as described above. In some embodiments, the sized fiber substrate is heated to between about 550 to about 800° C. to facilitate CNT synthesis. To initiate the growth of CNTs, two gases are bled into the reactor: a process gas such as argon, helium, or nitrogen, and a carbon-containing gas, such as acetylene, ethylene, ethanol or methane. CNTs grow at the sites of the CNT-forming catalyst.

In some embodiments, the CVD growth is plasma-enhanced. A plasma can be generated by providing an electric field during the growth process. CNTs grown under these conditions can follow the direction of the electric field. Thus, by adjusting the geometry of the reactor vertically aligned carbon nanotubes can be grown radially about a cylindrical fiber. In some embodiments, a plasma is not required for radial growth about the fiber. For carbon fiber materials that have distinct sides such as tapes, mats, fabrics, plies, and the like, catalyst can be disposed on one or both sides and correspondingly, CNTs can be grown on one or both sides as well.

As described above, CNT-synthesis is performed at a rate sufficient to provide a continuous process for functionalizing spoolable carbon fiber materials. Numerous apparatus configurations faciliate such continuous synthesis as exemplified below.

In some embodiments, CNT-infused carbon fiber materials can be constructed in an "all plasma" process. An all plasma process can being with roughing the carbon fiber material with a plasma as described above to improve fiber surface wetting characteristics and provide a more conformal barrier coating, as well as improve coating adhesion via mechanical interlocking and chemical adhesion through the use of functionalization of the carbon fiber material by using specific reactive gas species, such as oxygen, nitrogen, hydrogen in argon or helium based plasmas.

Barrier coated carbon fiber materials pass through numerous further plasma-mediated steps to form the final CNT-infused product. In some embodiments, the all plasma process can include a second surface modification after the barrier coating is cured. This is a plasma process for "roughing" the surface of the barrier coating on the carbon fiber material to facilitate catalyst deposition. As described above, surface modification can be achieved using a plasma of any one or more of a variety of different gases, including, without limitation, argon, helium, oxygen, ammonia, hydrogen, and nitrogen.

After surface modification, the barrier coated carbon fiber material proceeds to catalyst application. This is a plasma process for depositing the CNT-forming catalyst on the fibers. The CNT-forming catalyst is typically a transition metal as described above. The transition metal catalyst can be added to a plasma feedstock gas as a precursor in the form of a ferrofluid, a metal organic, metal salt or other composition for promoting gas phase transport. The catalyst can be applied at room temperature in the ambient environment with neither vacuum nor an inert atmosphere being required. In some embodiments, the carbon fiber material is cooled prior to catalyst application.

Continuing the all-plasma process, carbon nanotube synthesis occurs in a CNT-growth reactor. This can be achieved through the use of plasma-enhanced chemical vapor deposition, wherein carbon plasma is sprayed onto the catalyst-laden fibers. Since carbon nanotube growth occurs at elevated temperatures (typically in a range of about 500 to 1000° C. depending on the catalyst), the catalyst-laden fibers can be heated prior to exposing to the carbon plasma. For the infusion process, the carbon fiber material can be optionally heated until it softens. After heating, the carbon fiber material is ready to receive the carbon plasma. The carbon plasma is generated, for example, by passing a carbon containing gas such as acetylene, ethylene, ethanol, and the like, through an electric field that is capable of ionizing the gas. This cold carbon plasma is directed, via spray nozzles, to the carbon fiber material. The carbon fiber material can be in close proximity to the spray nozzles, such as within about 1 centimeter of the spray nozzles, to receive the plasma. In some embodiments, heaters are disposed above the carbon fiber material at the plasma sprayers to maintain the elevated temperature of the carbon fiber material.

Another configuration for continuous carbon nanotube synthesis involves a special rectangular reactor for the synthesis and growth of carbon nanotubes directly on carbon fiber materials. The reactor can be designed for use in a continuous in-line process for producing carbon-nanotube bearing fibers. In some embodiments, CNTs are grown via a chemical vapor deposition ("CVD") process at atmospheric pressure and at elevated temperature in the range of about 550° C. to about 800° C. in a multi-zone reactor. The fact that the synthesis occurs at atmospheric pressure is one factor that facilitates the incorporation of the reactor into a continuous processing line for CNT-on-fiber synthesis. Another advantage consistent with in-line continuous processing using such a zone reactor is that CNT growth occurs in a seconds, as opposed to minutes (or longer) as in other procedures and apparatus configurations typical in the art.

CNT synthesis reactors in accordance with the various embodiments include the following features:

Rectangular Configured Synthesis Reactors: The cross section of a typical CNT synthesis reactor known in the art is circular. There are a number of reasons for this including, for example, historical reasons (cylindrical reactors are often used in laboratories) and convenience (flow dynamics are easy to model in cylindrical reactors, heater systems readily accept circular tubes (quartz, etc.), and ease of manufacturing. Departing from the cylindrical convention, the present invention provides a CNT synthesis reactor having a rectangular cross section. The reasons for the departure are as follows: 1. Since many carbon fiber materials that can be processed by the reactor are relatively planar such as flat tape or sheet-like in form, a circular cross section is an inefficient use of the reactor volume. This inefficiency results in several drawbacks for cylindrical CNT synthesis reactors including, for example, a) maintaining a sufficient system purge; increased reactor volume requires increased gas flow rates to maintain the same level of gas purge. This results in a system that is inefficient for high volume production of CNTs in an open environment; b) increased carbon feedstock gas flow; the relative increase in inert gas flow, as per a) above, requires increased carbon feedstock gas flows. Consider that the volume of a 12K carbon fiber tow is 2000 times less than the total volume of a synthesis reactor having a rectangular cross section. In an equivalent growth cylindrical reactor (i.e., a cylindrical reactor that has a width that accommodates the same planarized carbon fiber material as the rectangular cross-section reactor), the volume of the carbon fiber material is 17,500 times less than the volume of the chamber. Although gas deposition processes, such as CVD, are typically governed by pressure and temperature alone, volume has a significant impact on the efficiency of deposition. With a rectangular reactor there is a still excess volume. This excess volume facilitates unwanted reactions; yet a cylindrical reactor has about eight times that volume. Due to this greater opportunity for competing reactions to occur, the desired reactions effectively occur more slowly in a cylindrical reactor chamber. Such a slow down in CNT growth, is problematic for the development of a continuous process. One benefit of a rectangular reactor configuration is that the reactor volume can be decreased by using a small height for the rectangular chamber to make this volume ratio better and reactions more efficient. In some embodiments of the present invention, the total volume of a rectangular synthesis reactor is no more than about 3000 times greater than the total volume of a carbon fiber material being passed through the synthesis reactor. In some further embodiments, the total volume of the rectangular synthesis reactor is no more than about 4000 times greater than the total volume of the carbon fiber material being passed through the synthesis reactor. In some still further embodiments, the total volume of the rectangular synthesis reactor is less than about 10,000 times greater than the total volume of the carbon fiber material being passed through the synthesis reactor. Additionally, it is notable that when using a cylindrical reactor, more carbon feedstock gas is required to provide the same flow percent as compared to reactors having a rectangular cross section. It should be appreciated that in some other embodiments, the synthesis reactor has a cross section that is described by polygonal forms that are not rectangular, but are relatively similar thereto and provide a similar reduction in reactor volume relative to a reactor having a circular cross section; c) problematic temperature distribution; when a relatively small-diameter reactor is used, the temperature gradient from the center of the chamber to the walls thereof is minimal. But with increased size, such as would be used for commercial-scale production, the temperature gradient increases. Such temperature gradients result in product quality variations across a carbon fiber material substrate (i.e., product quality varies as a function of radial position). This problem is substantially avoided when using a reactor having a rectangular cross section. In particular, when a planar substrate is used, reactor height can be maintained constant as the size of the substrate scales upward. Temperature gradients between the top and bottom of the reactor are essentially negligible and, as a consequence, thermal issues and the product-quality variations that result are avoided. 2. Gas introduction: Because tubular furnaces are normally employed in the art, typical CNT synthesis reactors introduce gas at one end and draw it through the reactor to the other end. In some embodiments disclosed herein, gas can be introduced at the center of the reactor or within a target growth zone, symmetrically, either through the sides or through the top and bottom plates of the reactor. This improves the overall CNT growth rate because the incoming feedstock gas is continuously replenishing at the hottest portion of the system, which is where CNT growth is most active. This constant gas replenishment is an important aspect to the increased growth rate exhibited by the rectangular CNT reactors.

Zoning. Chambers that provide a relatively cool purge zone depend from both ends of the rectangular synthesis reactor. Applicants have determined that if hot gas were to mix with the external environment (i.e., outside of the reactor), there would be an increase in degradation of the carbon fiber material. The cool purge zones provide a buffer between the internal system and external environments. Typical CNT synthesis reactor configurations known in the art typically require that the substrate is carefully (and slowly) cooled. The cool purge zone at the exit of the present rectangular CNT growth reactor achieves the cooling in a short period of time, as required for the continuous in-line processing.

Non-contact, hot-walled, metallic reactor. In some embodiments, a hot-walled reactor is made of metal is employed, in particular stainless steel. This may appear counterintuitive because metal, and stainless steel in particular, is more susceptible to carbon deposition (i.e., soot and by-product formation). Thus, most CNT reactor configurations use quartz reactors because there is less carbon deposited, quartz is easier to clean, and quartz facilitates sample observation. However, Applicants have observed that the increased soot and carbon deposition on stainless steel results in more consistent, faster, more efficient, and more stable CNT growth. Without being bound by theory it has been indicated that, in conjunction with atmospheric operation, the CVD process occurring in the reactor is diffusion limited. That is, the catalyst is "overfed;" too much carbon is available in the reactor system due to its relatively higher partial pressure (than if the reactor was operating under partial vacuum). As a consequence, in an open system—especially a clean one—too much carbon can adhere to catalyst particles, compromising their ability to synthesize CNTs. In some embodiments, the rectangular reactor is intentionally run when the reactor is "dirty," that is with soot deposited on the metallic reactor walls. Once carbon deposits to a monolayer on the walls of the reactor, carbon will readily deposit over itself. Since some of the available carbon is "withdrawn" due to this mechanism, the remaining carbon feedstock, in the form of radicals, react with the catalyst at a rate that does not poison the catalyst. Existing systems run "cleanly" which, if they were open for continuous processing, would produced a much lower yield of CNTs at reduced growth rates.

Although it is generally beneficial to perform CNT synthesis "dirty" as described above, certain portions of the apparatus, such as gas manifolds and inlets, can nonetheless negatively impact the CNT growth process when soot created blockages. In order to combat this problem, such areas of the CNT growth reaction chamber can be protected with soot inhibiting coatings such as silica, alumina, or MgO. In practice, these portions of the apparatus can be dip-coated in these soot inhibiting coatings. Metals such as INVAR® can be used with these coatings as INVAR has a similar CTE (coefficient of thermal expansion) ensuring proper adhesion of the coating at higher temperatures, preventing the soot from significantly building up in critical zones.

Combined Catalyst Reduction and CNT Synthesis. In the CNT synthesis reactor disclosed herein, both catalyst reduction and CNT growth occur within the reactor. This is significant because the reduction step cannot be accomplished timely enough for use in a continuous process if performed as a discrete operation. In a typical process known in the art, a reduction step typically takes 1-12 hours to perform. Both operations occur in a reactor in accordance with the present invention due, at least in part, to the fact that carbon feedstock gas is introduced at the center of the reactor, not the end as would be typical in the art using cylindrical reactors. The reduction process occurs as the fibers enter the heated zone; by this point, the gas has had time to react with the walls and cool off prior to reacting with the catalyst and causing the oxidation reduction (via hydrogen radical interactions). It is this transition region where the reduction occurs. At the hottest isothermal zone in the system, the CNT growth occurs, with the greatest growth rate occurring proximal to the gas inlets near the center of the reactor.

In some embodiments, when loosely affiliated carbon fiber materials, such as carbon tow are employed, the continuous process can include steps that spreads out the strands and/or filaments of the tow. Thus, as a tow is unspooled it can be spread using a vacuum-based fiber spreading system, for example. When employing sized carbon fibers, which can be relatively stiff, additional heating can be employed in order to "soften" the tow to facilitate fiber spreading. The spread fibers which comprise individual filaments can be spread apart sufficiently to expose an entire surface area of the filaments, thus allowing the tow to more efficiently react in subsequent process steps. Such spreading can approach between about 4 inches to about 6 inches across for a 3 k tow. The spread carbon tow can pass through a surface treatment step that is composed of a plasma system as described above. After a barrier coating is applied and roughened, spread fibers then can pass through a CNT-forming catalyst dip bath. The result is fibers of the carbon tow that have catalyst particles distributed radially on their surface. The catalyzed-laden fibers of the tow then enter an appropriate CNT growth chamber, such as the rectangular chamber described above, where a flow through atmospheric pressure CVD or PE-CVD process is used to synthesize the CNTs at rates as high as several microns per second. The fibers of the tow, now with radially aligned CNTs, exit the CNT growth reactor.

In some embodiments, CNT-infused carbon fiber materials can pass through yet another treatment process that, in some embodiments is a plasma process used to functionalize the CNTs. Additional functionalization of CNTs can be used to promote their adhesion to particular resins. Thus, in some embodiments, the present invention provides CNT-infused carbon fiber materials having functionalized CNTs.

As part of the continuous processing of spoolable carbon fiber materials, the a CNT-infused carbon fiber material can further pass through a sizing dip bath to apply any additional sizing agents which can be beneficial in a final product. Finally if wet winding is desired, the CNT-infused carbon fiber materials can be passed through a resin bath and wound on a mandrel or spool. The resulting carbon fiber material/resin combination locks the CNTs on the carbon fiber material allowing for easier handling and composite fabrication. In some embodiments, CNT infusion is used to provide improved filament winding. Thus, CNTs formed on carbon fibers such as carbon tow, are passed through a resin bath to produce resin-impregnated, CNT-infused carbon tow. After resin impregnation, the carbon tow can be positioned on the surface of a rotating mandrel by a delivery head. The tow can then be wound onto the mandrel in a precise geometric pattern in known fashion.

The winding process described above provides pipes, tubes, or other forms as are characteristically produced via a male mold. But the forms made from the winding process disclosed herein differ from those produced via conventional filament winding processes. Specifically, in the process disclosed herein, the forms are made from composite materials that include CNT-infused tow. Such forms will therefore benefit from enhanced strength and the like, as provided by the CNT-infused tow.

In some embodiments, a continuous process for infusion of CNTs on spoolable carbon fiber materials can achieve a linespeed between about 0.5 ft/min to about 36 ft/min. In this embodiment where the CNT growth chamber is 3 feet long and operating at a 750° C. growth temperature, the process can be run with a linespeed of about 6 ft/min to about 36 ft/min to produce, for example, CNTs having a length between about 100 nanometers to about 10 microns. The process can also be run with a linespeed of about 1 ft/min to about 6 ft/min to produce, for example, CNTs having a length between about 10 microns to about 100 microns. The process can be run with a linespeed of about 0.5 ft/min to about 1 ft/min to produce, for example, CNTs having a length between about 100 microns to about 200 microns. The CNT length is not tied only to linespeed and growth temperature, however, the flow rate of both the carbon feedstock and the inert carrier gases can also influence CNT length. For example, a flow rate consisting of less than 1% carbon feedstock in inert gas at high linespeeds (6 ft/min to 36 ft/min) will result in CNTs having a length between 1 micron to about 5 microns. A flow rate consisting of more than 1% carbon feedstock in inert gas at high linespeeds (6 ft/min to 36 ft/min) will result in CNTs having length between 5 microns to about 10 microns.

In some embodiments, more than one carbon material can be run simultaneously through the process. For example, multiple tapes tows, filaments, strand and the like can be run through the process in parallel. Thus, any number of prefabricated spools of carbon fiber material can be run in parallel through the process and re-spooled at the end of the process. The number of spooled carbon fiber materials that can be run in parallel can include one, two, three, four, five, six, up to any number that can be accommodated by the width of the CNT-growth reaction chamber. Moreover, when multiple carbon fiber materials are run through the process, the number of collection spools can be less than the number of spools at the start of the process. In such embodiments, carbon strands, tows, or the like can be sent through a further process of combining such carbon fiber materials into higher ordered carbon fiber materials such as woven fabrics or the like. The continuous process can also incorporate a post processing chopper that facilitates the formation CNT-infused chopped fiber mats, for example.

Processes of the invention for CNT infusion to fiber materials allow control of the CNT lengths with uniformity and in a continuous process allowing spoolable fiber materials to be functionalized with CNTs at high rates. With material residence times between 5 to 300 seconds, linespeeds in a continuous process for a system that is 3 feet long can be in a range anywhere from about 0.5 ft/min to about 36 ft/min and greater. The speed selected depends on various parameters as explained further below.

In some embodiments, a material residence time of about 5 to about 30 seconds can produce CNTs having a length between about 100 nanometers to about 10 microns. In some embodiments, a material residence time of about 30 to about 180 seconds can produce CNTs having a length between about 10 microns to about 100 microns. In still further embodiments, a material residence time of about 180 to about 300 seconds can produce CNTs having a length between about 100 microns to about 500 microns. One skilled in the art will recognize that these ranges are approximate and that CNT length can also be modulated by reaction temperatures, and carrier and carbon feedstock concentrations and flow rates.

EXAMPLE

This example shows how a carbon fiber material can be infused with CNTs in a continuous process to enhance signature control capabilities in composite structures.

In this example, the maximum loading of CNTs on fibers is targeted. 34-700 12 k carbon fiber tow with a tex value of 800 (Grafil Inc., Sacramento, Calif.) is implemented as the carbon fiber substrate. The individual filaments in this carbon fiber tow have a diameter of approximately 7 µm.

Figure 12:
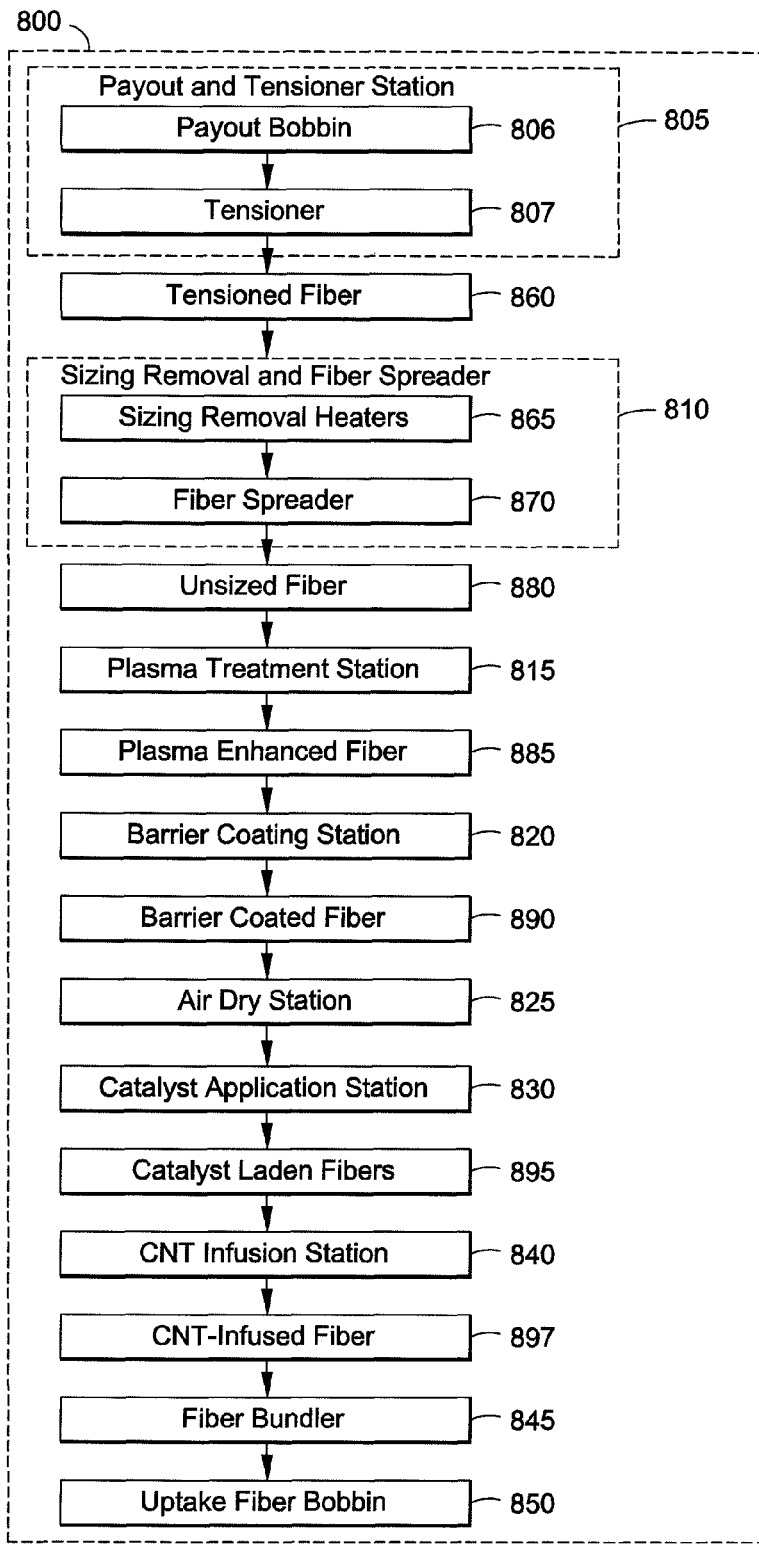
FIG. 12 shows how a carbon fiber material can be infused with CNTs in a continuous process to target thermal and electrical conductivity improvements for radar absorption.

FIG. 12 depicts system 800 for producing CNT-infused fiber in accordance with the illustrative embodiment of the present invention. System 800 includes a carbon fiber material payout and tensioner station 805, sizing removal and fiber spreader station 810, plasma treatment station 815, barrier coating application station 820, air dry station 825, catalyst application station 830, solvent flash-off station 835, CNT-infusion station 840, fiber bundler station 845, and carbon fiber material uptake bobbin 850, interrelated as shown.

Payout and tension station 805 includes payout bobbin 806 and tensioner 807. The payout bobbin delivers carbon fiber material 860 to the process; the fiber is tensioned via tensioner 807. For this example, the carbon fiber is processed at a linespeed of 2 ft/min.

Fiber material 860 is delivered to sizing removal and fiber spreader station 810 which includes sizing removal heaters 865 and fiber spreader 870. At this station, any "sizing" that is on fiber 860 is removed. Typically, removal is accomplished by burning the sizing off of the fiber. Any of a variety of heating means can be used for this purpose, including, for example, an infrared heater, a muffle furnace, and other non-contact heating processes. Sizing removal can also be accomplished chemically. The fiber spreader separates the individual elements of the fiber. Various techniques and apparatuses can be used to spread fiber, such as pulling the fiber over and under flat, uniform-diameter bars, or over and under variable-diameter bars, or over bars with radially-expanding grooves and a kneading roller, over a vibratory bar, etc. Spreading the fiber enhances the effectiveness of downstream operations, such as plasma application, barrier coating application, and catalyst application, by exposing more fiber surface area.

Multiple sizing removal heaters 865 can be placed throughout the fiber spreader 870 which allows for gradual, simultaneous desizing and spreading of the fibers. Payout and tension station 805 and sizing removal and fiber spreader station 810 are routinely used in the fiber industry; those skilled in the art will be familiar with their design and use.

The temperature and time required for burning off the sizing vary as a function of (1) the sizing material and (2) the commercial source/identity of carbon fiber material 860. A conventional sizing on a carbon fiber material can be removed at about 650° C. At this temperature, it can take as long as 15 minutes to ensure a complete burn off of the sizing. Increasing the temperature above this burn temperature can reduce burn-off time. Thermogravimetric analysis is used to determine minimum burn-off temperature for sizing for a particular commercial product.

Depending on the timing required for sizing removal, sizing removal heaters may not necessarily be included in the CNT-infusion process proper; rather, removal can be performed separately (e.g., in parallel, etc.). In this way, an inventory of sizing-free carbon fiber material can be accumulated and spooled for use in a CNT-infused fiber production line that does not include fiber removal heaters. The sizing-free fiber is then spooled in payout and tension station 805. This production line can be operated at higher speed than one that includes sizing removal.

Unsized fiber 880 is delivered to plasma treatment station 815. For this example, atmospheric plasma treatment is utilized in a 'downstream' manner from a distance of 1 mm from the spread carbon fiber material. The gaseous feedstock is comprised of 100% helium.

Plasma enhanced fiber 885 is delivered to barrier coating station 820. In this illustrative example, a siloxane-based barrier coating solution is employed in a dip coating configuration. The solution is 'Accuglass T-11 Spin-On Glass' (Honeywell International Inc., Morristown, N.J.) diluted in isopropyl alcohol by a dilution rate of 40 to 1 by volume. The resulting barrier coating thickness on the carbon fiber material is approximately 40 nm. The barrier coating can be applied at room temperature in the ambient environment.

Barrier coated carbon fiber 890 is delivered to air dry station 825 for partial curing of the nanoscale barrier coating. The air dry station sends a stream of heated air across the entire carbon fiber spread. Temperatures employed can be in the range of 100° C. to about 500° C.

After air drying, barrier coated carbon fiber 890 is delivered to catalyst application station 830. In this example, an iron oxide-based CNT forming catalyst solution is employed in a dip coating configuration. The solution is 'EFH-1' (Ferrotec Corporation, Bedford, N.H.) diluted in hexane by a dilution rate of 200 to 1 by volume. At the process linespeed for CNT-infused fiber targeted at enhancing signature control characteristics, the fiber will remain in the dip bath for 10 seconds. The catalyst can be applied at room temperature in the ambient environment with neither vacuum nor an inert atmosphere required. A monolayer of catalyst coating is achieved on the carbon fiber material. 'EFH-1' prior to dilution has a nanoparticle concentration ranging from 3-15% by volume. The iron oxide nanoparticles are of composition $Fe_2O_3$ and $Fe_3O_4$ and are approximately 8 nm in diameter.

Catalyst-laden carbon fiber material 895 is delivered to solvent flash-off station 835. The solvent flash-off station sends a stream of air across the entire carbon fiber spread. In this example, room temperature air can be employed in order to flash-off all hexane left on the catalyst-laden carbon fiber material.

After solvent flash-off, catalyst-laden fiber 895 is finally advanced to CNT-infusion station 840. In this example, a rectangular reactor with a 12 inch growth zone is used to employ CVD growth at atmospheric pressure. 97.6% of the total gas flow is inert gas (Nitrogen) and the other 2.4% is the carbon feedstock (acetylene). The growth zone is held at 750° C. For the rectangular reactor mentioned above, 750° C. is a relatively high growth temperature, which allows for the highest growth rates possible. Catalyst laden fibers are exposed to the CNT growth environment for 30 seconds in this example, resulting in 60 micron long with approximately 4% volume percentage CNTs infused to the carbon fiber surface.

After CNT-infusion, CNT-infused fiber 897 is re-bundled at fiber bundler station 845. This operation recombines the individual strands of the fiber, effectively reversing the spreading operation that was conducted at station 810.

The bundled, CNT-infused fiber 897 is wound about uptake fiber bobbin 850 for storage. CNT-infused fiber 897 is then ready for use in a variety of applications which require enhanced signature control characteristics. In this case, this material is dry wound and resin infused to act as the back layer of a RAM panel as shown in FIG. 13. The resulting panel layer of the above described procedure has between 2-4% CNTs by weight in the composite structure.

It is noteworthy that some of the operations described above can be conducted under inert atmosphere or vacuum for environmental isolation. For example, if sizing is being burned off of a carbon fiber material, the fiber can be environmentally isolated to contain off-gassing and prevent damage from moisture. For convenience, in system 800, environmental isolation is provided for all operations, with the exception of carbon fiber material payout and tensioning, at the beginning of the production line, and fiber uptake, at the end of the production line.

It is to be understood that the above-described embodiments are merely illustrative of the present invention and that many variations of the above-described embodiments can be devised by those skilled in the art without departing from the scope of the invention. For example, in this Specification, numerous specific details are provided in order to provide a thorough description and understanding of the illustrative embodiments of the present invention. Those skilled in the art will recognize, however, that the invention can be practiced without one or more of those details, or with other processes, materials, components, etc.

Furthermore, in some instances, well-known structures, materials, or operations are not shown or described in detail to avoid obscuring aspects of the illustrative embodiments. It is understood that the various embodiments shown in the Figures are illustrative, and are not necessarily drawn to scale. Reference throughout the specification to "one embodiment" or "an embodiment" or "some embodiments" means that a particular feature, structure, material, or characteristic described in connection with the embodiment(s) is included in at least one embodiment of the present invention, but not necessarily all embodiments. Consequently, the appearances of the phrase "in one embodiment," "in an embodiment," or "in some embodiments" in various places throughout the Specification are not necessarily all referring to the same embodiment. Furthermore, the particular features, structures, materials, or characteristics can be combined in any suitable manner in one or more embodiments. It is therefore intended that such variations be included within the scope of the following claims and their equivalents.

What is claimed is:

1. A radar absorbing composite comprising a carbon nanotube-infused fiber material disposed in at least a portion of a matrix material, the composite being capable of absorbing radar in a frequency range from between about 0.10 Megahertz to about 60 Gigahertz, the carbon nanotube-infused fiber material forming a first layer that reduces radar reflectance and a second layer that dissipates the energy of the absorbed radar.

2. The composite of claim 1 further comprising a plurality of transition metal nanoparticles.

3. The composite of claim 2, wherein the nanoparticles comprise iron.

4. The composite of claim 1, further comprising a plurality of additional layers between the first layer and the second layer.

5. The composite of claim 4, wherein the plurality of additional layers comprises a stepped gradient of increasing carbon nanotube density on the carbon nanotube-infused fiber material from the first layer down to the second layer.

6. The composite of claim 4, wherein the plurality of additional layers comprises a continuous gradient of increasing carbon nanotube density on the carbon nanotube-infused fiber material from the first layer down to the second layer.

7. The composite of claim 1, wherein the first layer and the second layer comprise separate carbon nanotube-infused fiber materials.

8. The composite of claims 7, wherein the first layer comprises a carbon nanotube-infused glass fiber material.

9. The composite of claim 7, wherein the second layer comprises a carbon nanotube-infused carbon fiber material.

10. The composite of claim 1, wherein the carbon nanotubes are present in a range between about 0.001% by weight to about 20% by weight of the composite.

11. The composite material of claim 1, wherein the carbon nanotube-infused fiber material comprises a fiber material selected from glass, carbon, and ceramic.

12. The composite material of claim 1, wherein the carbon nanotubes infused on the fiber material have a controlled orientation within the composite.

13. A method of manufacturing a radar absorbing composite, the composite comprising a carbon nanotube-infused fiber material disposed in at least a portion of a matrix material, the composite being capable of absorbing radar in a frequency range from between about 0.10 Megahertz to about 60 Gigahertz, the carbon nanotube-infused fiber material forming a first layer that reduces radar reflectance and a second layer that dissipates the energy of the absorbed radar, the method comprising disposing a carbon nanotube-infused fiber material in a portion of a matrix material with a controlled orientation of the carbon nanotube-infused fiber material within the matrix material, and curing the matrix material, wherein the controlled orientation of the carbon nanotube-infused fiber material controls the relative orientation of carbon nanotubes-infused thereon.

14. A panel comprising a composite, the composite comprising a carbon nanotube-infused fiber material disposed in at least a portion of a matrix material, the composite being capable of absorbing radar in a frequency range from between about 0.10 Megahertz to about 60 Gigahertz, the carbon nanotube-infused fiber material forming a first layer that reduces radar reflectance and a second layer that dissipates the energy of the absorbed radar, the panel being adaptable as a structural component of a transport vessel or missile for use in stealth applications.

15. A transport vessel comprising the panel of claim 14, wherein the carbon nanotubes infused on the fiber material have a controlled orientation within the composite material.

16. The transport vessel of claim 15, wherein the transport vessel is selected from a boat, a plane, and a ground vehicle.

17. A projectile comprising the panel of claim 14, wherein the carbon nanotubes infused on the fiber material have a controlled orientation within the composite material.

* * * * *